(12) United States Patent
Song et al.

(10) Patent No.: US 12,310,019 B2
(45) Date of Patent: May 20, 2025

(54) SEMICONDUCTOR DEVICE INCLUDING DAM STRUCTURE HAVING AIR GAP AND ELECTRONIC SYSTEM INCLUDING THE SAME

(71) Applicant: Samsung Electronics Co., Ltd., Suwon-si (KR)

(72) Inventors: Hyeonjoo Song, Hwaseong-si (KR); Byoungtaek Kim, Seongnam-si (KR); Haemin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 606 days.

(21) Appl. No.: 17/689,391

(22) Filed: Mar. 8, 2022

(65) Prior Publication Data
US 2022/0384479 A1 Dec. 1, 2022

(30) Foreign Application Priority Data
May 25, 2021 (KR) .......................... 10-2021-0066910

(51) Int. Cl.
*H10B 43/27* (2023.01)
*H01L 23/00* (2006.01)
(Continued)

(52) U.S. Cl.
CPC ........... *H10B 43/27* (2023.02); *H01L 23/562* (2013.01); *H10B 43/10* (2023.02); *H10B 43/40* (2023.02)

(58) Field of Classification Search
CPC ................... H01L 23/562; H01L 25/18; H01L 2225/06506; H01L 2225/0651;
(Continued)

(56) References Cited

U.S. PATENT DOCUMENTS 8,822,322 B2 9/2014 Lee et al.
9,397,111 B1 * 7/2016 Chowdhury ........... H10B 43/35
(Continued)

FOREIGN PATENT DOCUMENTS

KR 20100097459 A 9/2010
KR 20120020552 A 3/2012
(Continued)

*Primary Examiner* — Jeff W Natalini
*Assistant Examiner* — Nicholas Leland Hutson
(74) *Attorney, Agent, or Firm* — Myers Bigel, P.A.

(57) ABSTRACT

A semiconductor device includes a peripheral circuit structure, a semiconductor layer, a source conductive layer, a connecting mold layer, a support conductive layer, a buried insulating layer, a gate stack structure, a mold structure, a channel structure and a supporter through the gate stack structure, a THV through the mold structure and the buried insulating layer, a dam structure between the gate stack structure and the mold structure, an upper supporter layer on the dam structure, and a word line separation layer through the gate stack structure and the upper supporter layer. The dam structure includes a first spacer, a second spacer inside the first spacer, a lower supporter layer connected to the upper supporter layer and partially on or covering an inner side wall of the second spacer, and an air gap with a side wall defined by the second spacer and a top end defined by the lower supporter layer.

20 Claims, 25 Drawing Sheets

(51) Int. Cl.
*H10B 43/10* (2023.01)
*H10B 43/40* (2023.01)

(58) Field of Classification Search
CPC ....... H01L 2225/06541; H01L 25/0657; H01L 2225/06562; H01L 21/7682; H01L 21/823475; H10B 43/27; H10B 43/10; H10B 41/20; H10B 43/40; H10B 41/50; H10B 43/20; H10B 43/50; G11C 5/025
See application file for complete search history.

(56) References Cited

U.S. PATENT DOCUMENTS

| | | | |
|---|---|---|---|
| 9,559,112 | B2 | 1/2017 | Lee et al. |
| 9,837,433 | B2 | 12/2017 | Oh et al. |
| 10,566,343 | B2 | 2/2020 | Oh et al. |
| 10,804,289 | B2 | 10/2020 | Yang et al. |
| 11,121,121 | B2 * | 9/2021 | Or-Bach ................. H01L 25/18 |
| 11,387,142 | B1 * | 7/2022 | Matsuno ................. H10B 43/50 |
| 2013/0228928 | A1 * | 9/2013 | Kuge ..................... H10B 43/27 257/E21.294 |
| 2015/0236038 | A1 | 8/2015 | Pachamuthu et al. |
| 2019/0312050 | A1 * | 10/2019 | Lai ........................ H01L 23/528 |
| 2020/0035702 | A1 | 1/2020 | Lee et al. |
| 2020/0152653 | A1 | 5/2020 | Lu et al. |
| 2020/0295036 | A1 * | 9/2020 | Sotome ................. H01L 23/481 |
| 2021/0020657 | A1 | 1/2021 | Song |
| 2021/0036014 | A1 | 2/2021 | Yang et al. |
| 2022/0285385 | A1 * | 9/2022 | Lai ........................ H10B 43/27 |
| 2022/0367487 | A1 * | 11/2022 | Zhang ................... H10B 51/30 |

FOREIGN PATENT DOCUMENTS

| | | |
|---|---|---|
| KR | 20170125551 A | 11/2017 |
| KR | 20200008828 A | 1/2020 |
| KR | 20200011852 A | 2/2020 |
| KR | 20210008983 A | 1/2021 |

* cited by examiner

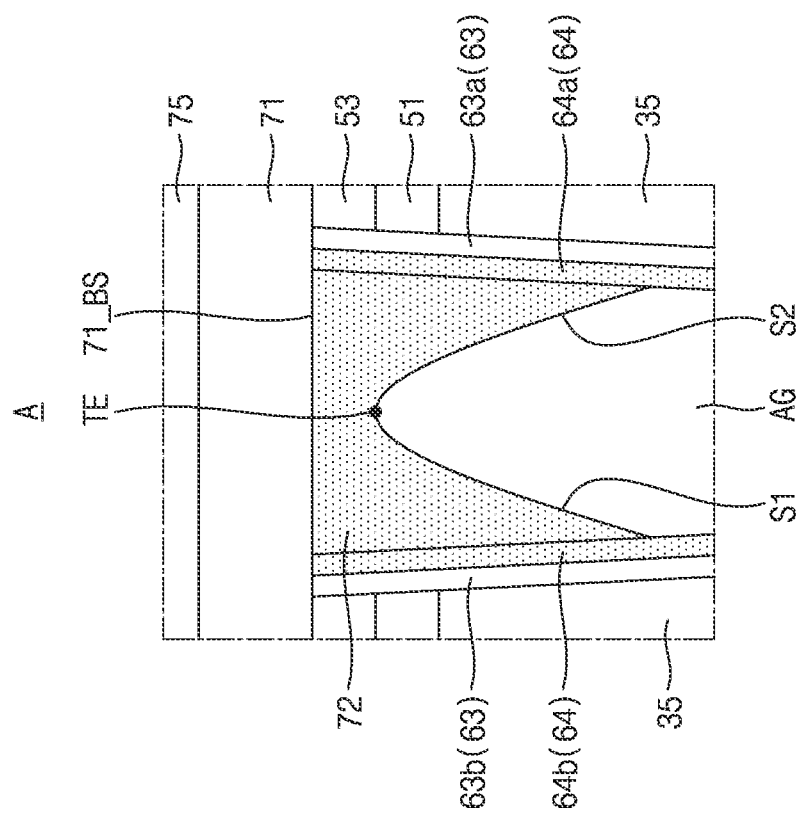

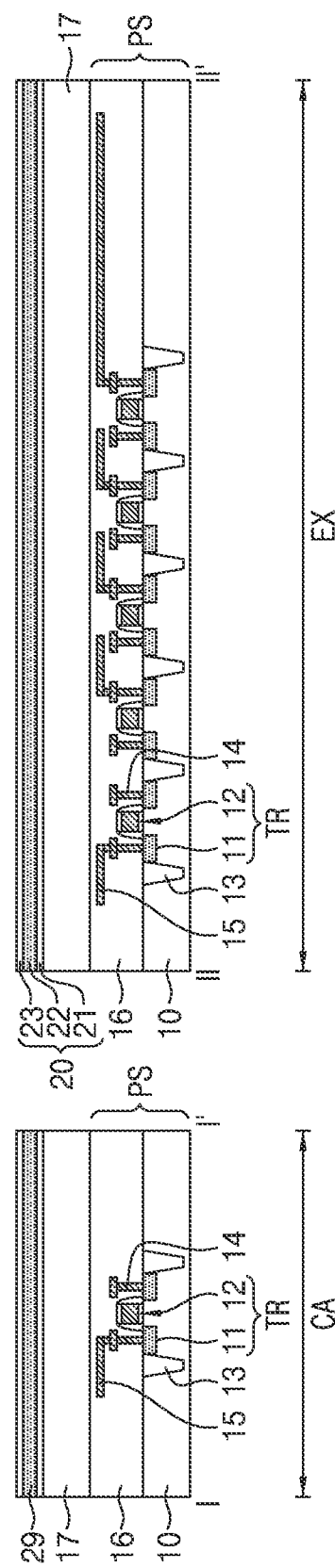

SEMICONDUCTOR DEVICE INCLUDING DAM STRUCTURE HAVING AIR GAP AND ELECTRONIC SYSTEM INCLUDING THE SAME

CROSS-REFERENCE TO THE RELATED APPLICATION

This application claims priority from Korean Patent Application No. 10-2021-0066910, filed on May 25, 2021, in the Korean Intellectual Property Office, the disclosure of which is incorporated herein by reference in its entirety.

BACKGROUND

1 Field

The example embodiments of the disclosure relate to a semiconductor device including a dam structure and an electronic system including the same.

2. Description of the Related Art

In an electronic system requiring storage of data, a semiconductor device capable of storing large volumes of data is needed. Accordingly, research on a scheme capable of increasing the data storage capacity of a semiconductor device is being conducted. For example, as one of methods for increasing the data storage capacity of a semiconductor device, a semiconductor device including three-dimensionally arranged memory cells in place of two-dimensionally arranged memory cells is proposed.

SUMMARY

The example embodiments of the disclosure provide a semiconductor device and a manufacturing method thereof which are capable of reducing process costs while achieving an enhancement in reliability.

A semiconductor device according to an example embodiment of the disclosure may include a peripheral circuit structure including a substrate and a transistor, the substrate including a cell area and an extension area, a semiconductor layer on the peripheral circuit structure, a source conductive layer on the semiconductor layer in the cell area, a connecting mold layer on the semiconductor layer in the extension area, a support conductive layer on the source conductive layer and the connecting mold layer, a buried insulating layer on the peripheral circuit structure in the extension area and contacting a side wall of the semiconductor layer, a gate stack structure on the support conductive layer, a mold structure on the buried insulating layer, a channel structure and a supporter layer extending through the gate stack structure, a through hole via (THV) extending through the mold structure and the buried insulating layer, and a dam structure between the gate stack structure and the mold structure. The supporter layer comprises an upper supporter layer on the dam structure, and a lower supporter layer. A word line separation layer extends through the gate stack structure and the upper supporter layer. The dam structure may include a first spacer, a second spacer inside the first spacer, a lower supporter layer connected to the upper supporter layer and on a portion of an inner side wall of the second spacer, and an air gap with a side wall defined by the second spacer and a top end defined by the lower supporter layer.

A semiconductor device according to an example embodiment of the disclosure may include a gate stack structure in which gate electrodes and gate insulating layers are alternately and repeatedly stacked, a mold structure in which sacrificial layers and gate insulating layers are alternately and repeatedly stacked, a dam structure between the gate stack structure and the mold structure that surrounds the mold structure, a channel structure extending through the gate stack structure, a through hole via (THV) inside the dam structure and extending through the mold structure, an upper supporter layer on the gate stack structure, the mold structure, the dam structure, the channel structure and the THV, and a word line separation layer extending through the gate stack structure and the upper supporter layer. The dam structure may include a first spacer, a second spacer inside the first spacer, a lower supporter layer connected to the upper supporter layer and on at least a portion of an inner side wall of the second spacer, and an air gap with a side wall defined by the second spacer. At least a portion of the air gap may extend into the lower supporter layer.

An electronic system according to an example embodiment of the disclosure may include a main substrate, a semiconductor device on the main substrate, and a controller electrically connected to the semiconductor device on the main substrate. The semiconductor device may include a semiconductor layer and a buried insulating layer, a gate stack structure in which gate electrodes and gate insulating layers are alternately and repeatedly stacked, the gate stack structure being positioned on the semiconductor layer, a mold structure in which sacrificial layers and gate insulating layers are alternately and repeatedly stacked, the mold structure being positioned on the buried insulating layer, a dam structure between the gate stack structure and the mold structure that surrounds the mold structure, a channel structure extending through the gate stack structure, a through hole via (THV) inside the dam structure and extending through the mold structure and the buried insulating layer, an upper supporter layer on the gate stack structure, the mold structure, the dam structure, the channel structure and the THV, and a word line separation layer extending through the gate stack structure and the upper supporter layer. The dam structure may include a spacer extending between the gate stack structure and the mold structure, a lower supporter layer connected to the upper supporter layer and on a portion of an inner side wall of the spacer, and an air gap defined by the semiconductor layer, the spacer and the lower supporter layer.

BRIEF DESCRIPTION OF THE DRAWINGS

FIG. 12 is an enlarged view of the portion A of FIG. 6 according to an example embodiment of the disclosure.

FIGS. 20 to 29 are cross-sectional views explaining a method for forming a semiconductor device in accordance with an example embodiment of the disclosure.

DETAILED DESCRIPTION OF EXAMPLE EMBODIMENTS

Figure 1:
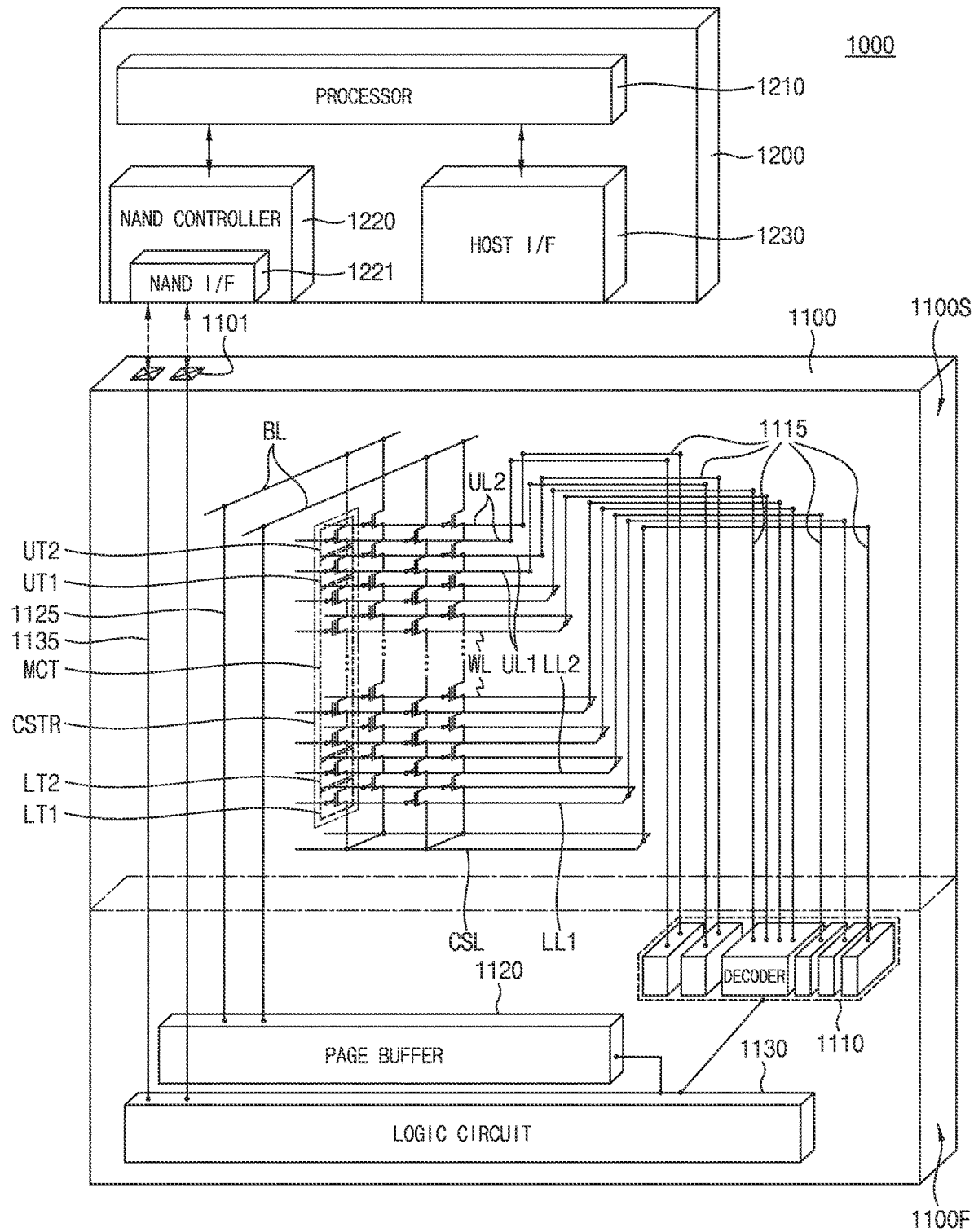
FIG. 1 is a view schematically showing an electronic system including a semiconductor device according to an example embodiment of the disclosure.

FIG. 1 is a view schematically showing an electronic system including a semiconductor device according to an example embodiment of the disclosure.

Referring to FIG. 1, an electronic system 1000 according to an example embodiment of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB) thumb drive, a computing system, a medical device or a communication device which includes one semiconductor device 1100 or a plurality of semiconductor devices 1100.

The semiconductor device 1100 may be a non-volatile memory device. For example, the semiconductor device 1100 may be a NAND flash memory device which will be described later with reference to FIGS. 5 to 19. The semiconductor device 1100 may include a first structure 1100F, and a second structure 1100S on the first structure 1100F. In example embodiments, the first structure 1100F may be positioned at one side of the second structure 1100S. The first structure 1100F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT positioned between the lower transistors LT1 and LT2 and the upper transistors UT1 and UT2. The number of lower transistors LT1 and LT2 and the number of upper transistors UT1 and UT2 may be diversely varied in accordance with embodiments.

In example embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 via first connecting lines 1115 extending from an inside of the first structure 1100F to the second structure 1100S. The bit lines BL may be electrically connected to the page buffer 1120 via second connecting lines 1125 extending from the inside of the first structure 1100F to the second structure 1100S.

In the first structure 1100F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 via an input/output connecting line 1135 extending from the inside of the first structure 1100F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

Figure 2:
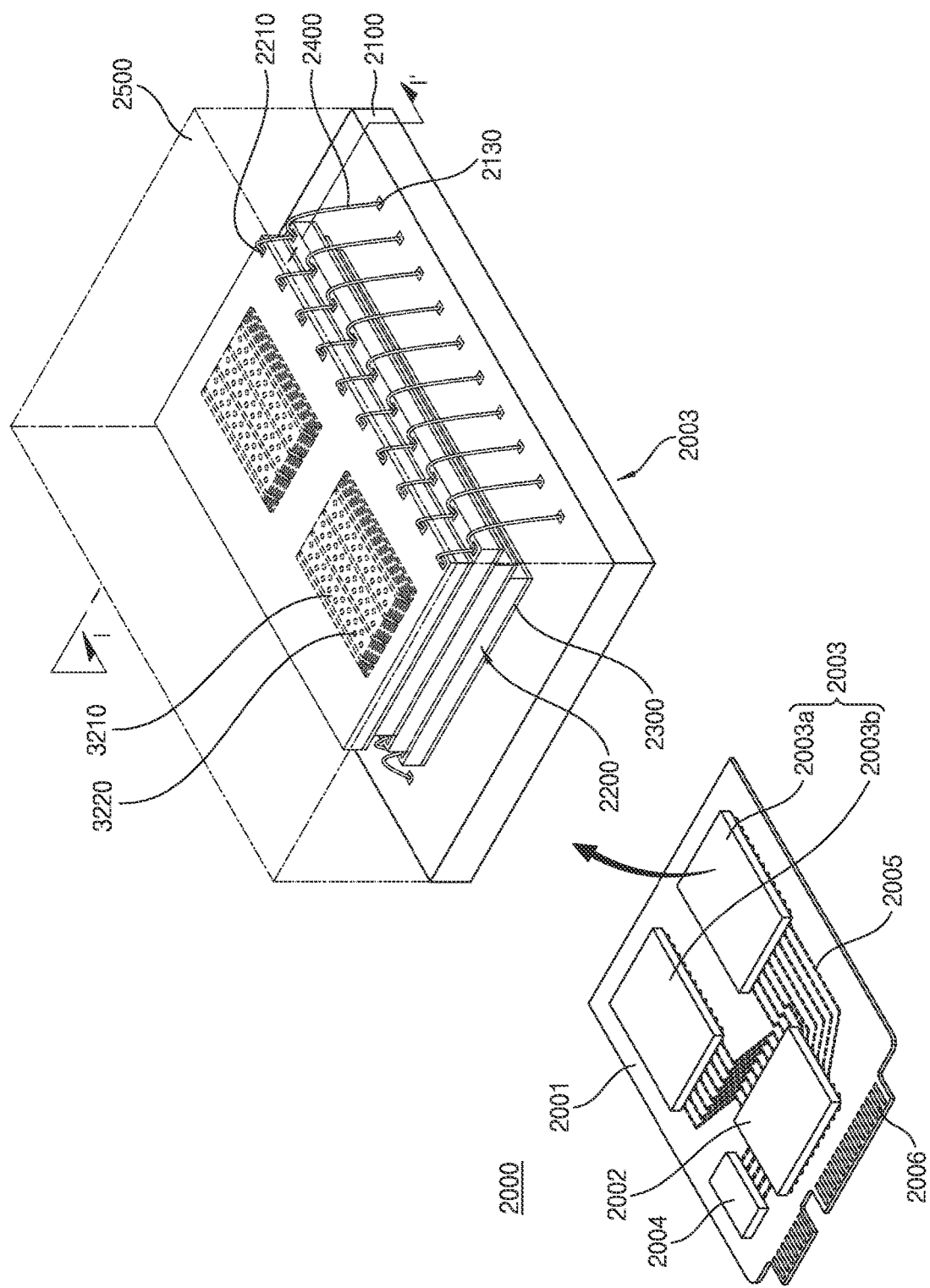
FIG. 2 is a perspective view schematically showing an electronic system including a semiconductor device according to an example embodiment of the disclosure.

FIG. 2 is a perspective view schematically showing an electronic system including a semiconductor device according to an example embodiment of the disclosure.

Referring to FIG. 2, an electronic system 2000 according to an example embodiment of the disclosure may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and arrangement of the plurality of pins in the connector 2006 may be varied in accordance with a communication interface between the electronic system 2000 and the external host. In example embodiments, the electronic system 2000 may communicate with the external host in accordance with any one of interfaces such as a universal serial bus (USB), peripheral component interconnect express (PCI-Express), serial advanced technology attachment (SATA), M-PHY for universal flash storage (UFS), etc. In example embodiments, the electronic system 2000 may operate by power supplied from the external host via the connector 2006. The electronic system 2000 may further include a power management integrated circuit (PMIC) for distributing power supplied from the external host to the controller 2002 and the semiconductor package 2003.

The controller 2002 may write data in the semiconductor package 2003 or may read out data from the semiconductor package 2003. The controller 2002 may also enhance an operation speed of the electronic system 2000.

The DRAM 2004 may be a buffer memory for reducing a speed difference between the semiconductor package 2003, which is a data storage space, and the external host. The DRAM 2004, which is included in the electronic system 2000, may also operate as a kind of cache memory. The DRAM 2004 may provide a space for temporarily storing data in a control operation for the semiconductor package 2003. When the DRAM 2004 is included in the electronic system 2000, the controller 2002 may further include a DRAM controller for controlling the DRAM 2004, in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, bonding layers 2300 respectively positioned at bottom surfaces of the semiconductor chips 2200, a connecting structure 2400 for electrically connecting the semiconductor chips 2200 and the package substrate 2100, and a molding layer 2500 covering the semiconductor chips 2200 and the connecting structure 2400 on the package substrate 2100.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stack structures 3210 and channel structures 3220. Each of the semiconductor chips 2200 may include a semiconductor device which will be described later with reference to FIGS. 5 to 19.

In example embodiments, the connecting structure 2400 may be a bonding wire for electrically connecting the input/output pad 2210 and the package upper pads 2130. Accordingly, in each of the first and second semiconductor packages 2003a and 2003b, the semiconductor chips 2200 may be electrically interconnected through wire bonding, and may be electrically connected to the corresponding package upper pads 2130 of the package substrate 2100. In accordance with embodiments, in each of the first and second semiconductor packages 2003a and 2003b, the semiconductor chips 2200 may be electrically interconnected by a connecting structure including a through-silicon via (TSV) in place of the bonding wire type connecting structure 2400.

In example embodiments, the controller 2002 and the semiconductor chips 2200 may be included in one package. In an example embodiment, the controller 2002 and the semiconductor chips 2200 may be mounted on a separate interposer substrate different from the main substrate 2001. In this case, the controller 2002 and the semiconductor chips 2200 may be interconnected by wirings formed at the interposer substrate.

Figure 3:
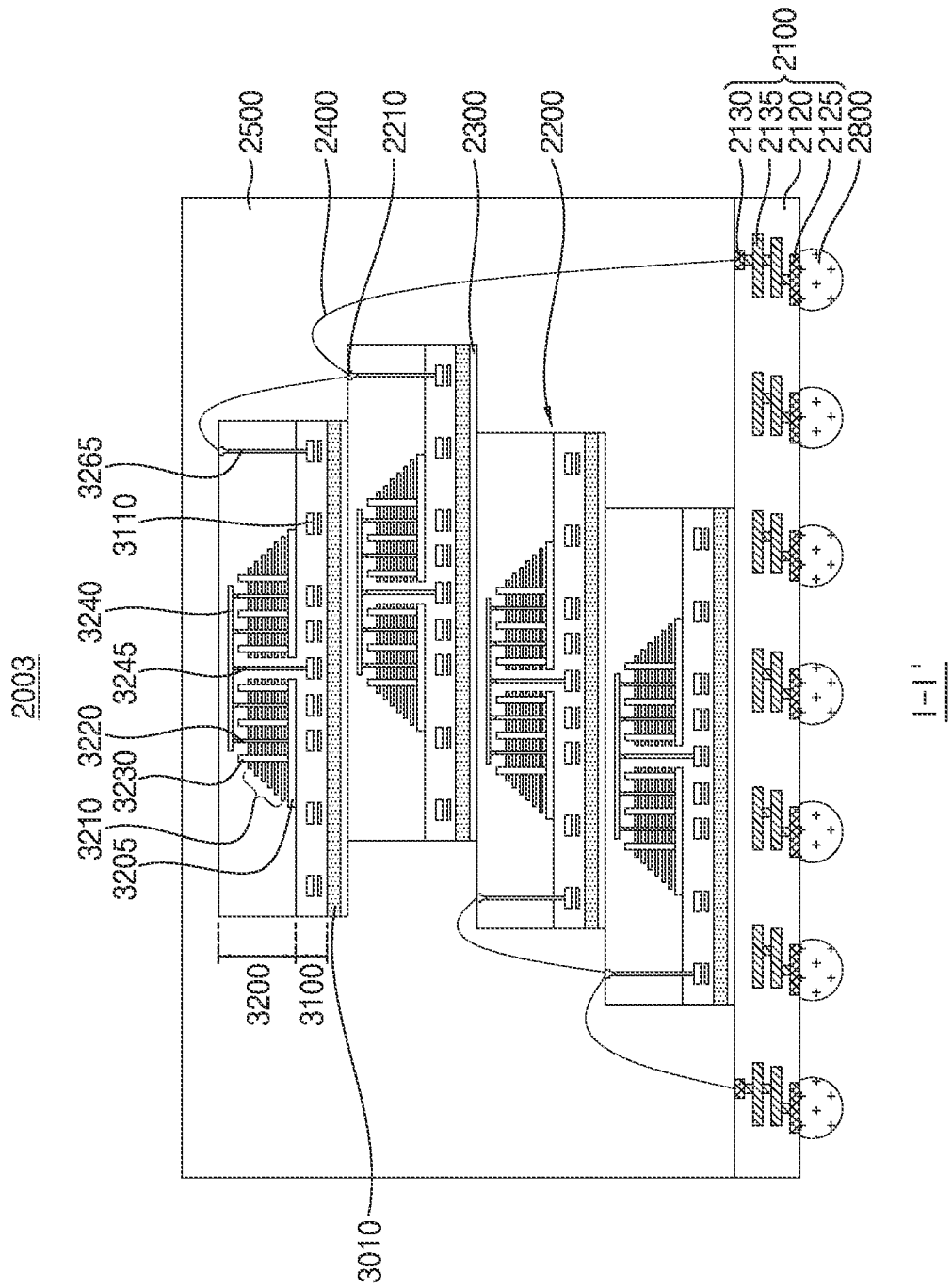
FIGS. 3 and 4 are sectional views schematically showing semiconductor packages according to example embodiments of the disclosure.
Figure 4:
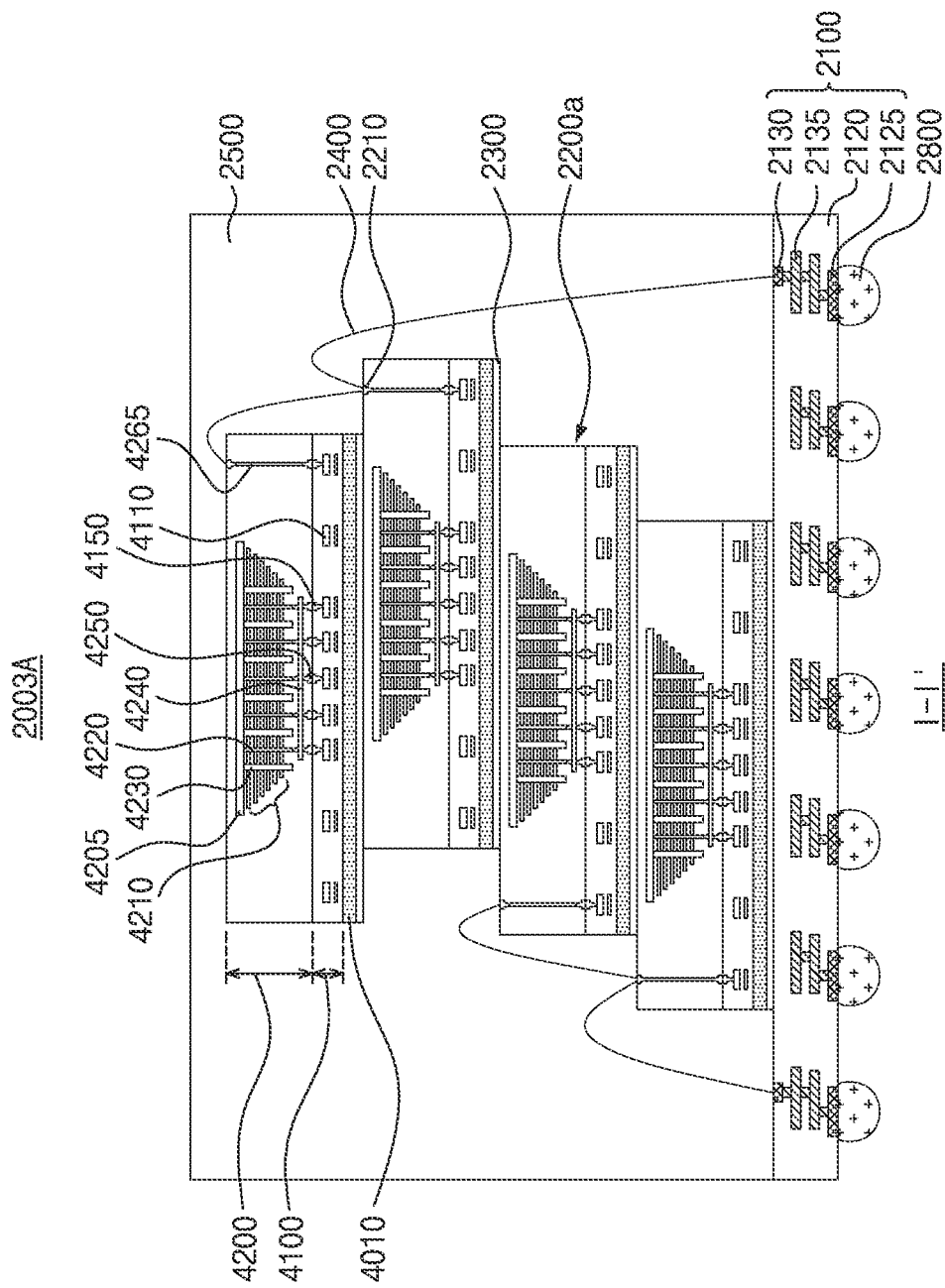

FIGS. 3 and 4 are cross-sectional views schematically showing semiconductor packages according to example embodiments of the disclosure. Each of FIGS. 3 and 4 explains an example embodiment of the semiconductor package 2003 of FIG. 2, and conceptually shows an area of the semiconductor package 2003 taken along line I-I' in FIG. 2.

Referring to FIG. 3, in the semiconductor package 2003, the package substrate 2100 thereof may be a printed circuit board. The package substrate 2100 may include a package substrate body 2120, package upper pads 2130 positioned at a top surface of the package substrate body 2120, lower pads 2125 positioned at a bottom surface of the package substrate body 2120 or exposed through the bottom surface of the package substrate body 2120, and inner wirings 2135 electrically interconnecting the package upper pads 2130 and the lower pads 2125 within the package substrate body 2120. The package upper pads 2130 may be electrically connected to connecting structures 2400. The lower pads 2125 may be connected to the wiring patterns 2005 of the main substrate 2010 of the electronic system 2000 through conductive connectors 2800, as shown in FIG. 2.

Figure 7:
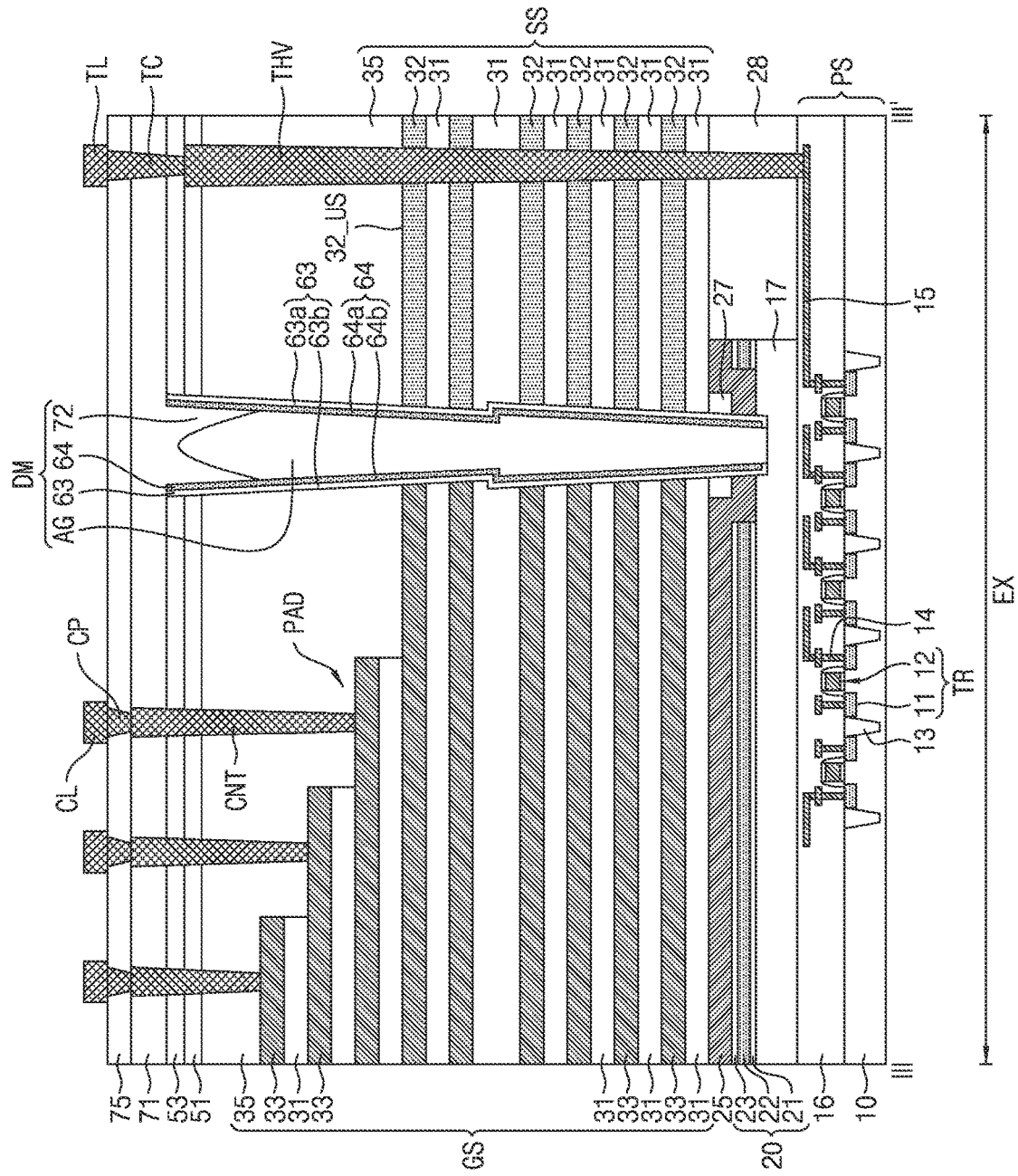
FIG. 7 is a cross-sectional view taken along line of FIG. 5.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a source structure 3205, a gate stack structure 3210 on the source structure 3205, channel structures 3220 and word line separation structures 3230 extending through the gate stack structure 3210, bit lines 3240 electrically connected to the channel structures 3220, and gate contact plugs ("CNT" in FIG. 7) electrically connected to word lines ("WL" in FIG. 1) of the gate stack structure 3210. The second structure 3200 may further include a dam structure DM, as shown in FIG. 7 which is an enlarged view of FIG. 3.

Each of the semiconductor chips 2200 may include a through hole via (THV) 3245 electrically connected to the peripheral wirings 3110 of the first structure 3100 and extending into the second structure 3200. The THV 3245 may extend through a stack structure (cf. "SS" in FIG. 6) positioned at one side of the gate stack structure 3210, and may be further positioned outside the gate stack structure 3210. Each of the semiconductor chips 2200 may further include an input/output connecting wiring 3265 electrically connected to the peripheral wirings 3110 of the first structure 3100 and extending into the second structure 3200, and an input/output pad 2210 electrically connected to the input/output connecting wiring 3265.

Referring to FIG. 4, in a semiconductor package 2003A, each of semiconductor chips 2200a thereof may include a semiconductor substrate 4010, a first structure 4100 on the semiconductor substrate 4010, and a second structure 4200 bonded to the first structure 4100 in a wafer bonding manner on the first structure 4100.

The first structure 4100 may include a peripheral circuit region including a peripheral wiring 4110 and first bonding structures 4150. The second structure 4200 may include a source structure 4205, a gate stack structure 4210 between the source structure 4205 and the first structure 4100, channel structures 4220 and a word line separation structure 4230 extending through the gate stack structure 4210, and second bonding structures 4250 electrically connected to the channel structures 4220 and word lines of the gate stack structure 4210 ("WL" in FIG. 1), respectively. For example, the second bonding structures 4250 may be electrically connected to the channel structures 4220 and the word lines ("WL" in FIG. 1) through bit lines 4240 electrically connected to the channel structures 4220 and gate contact plugs ("CNT" in FIG. 7) electrically connected to the word lines ("WL" in FIG. 1), respectively. The first bonding structures 4150 of the first structure 4100 and the second bonding structures 4250 of the second structure 4200 may be bonded to each other while contacting each other. Bonding portions of the first bonding structures 4150 and the second bonding structures 4250 may be made of, for example, copper (Cu).

The second structure 4200 may further include a dam structure DM, as shown in FIG. 7. Each of the semiconductor chips 2200*a* may further include an input/output pad 2210, and an input/output connecting wiring 4265 under the input/output pad 2210. The input/output connecting wiring 4265 may be electrically connected to a part of the second bonding structures 4210.

The semiconductor chips 2200 of FIG. 3 and the semiconductor chips 2200*a* of FIG. 4 may be electrically interconnected by bonding wire type connecting structures 2400. Of course, in example embodiments, semiconductor chips in one semiconductor package such as the semiconductor chips 2200 of FIG. 3 and the semiconductor chips 2200*a* of FIG. 4 may be electrically interconnected by a connecting structure including a through-silicon via (TSV).

Figure 5:
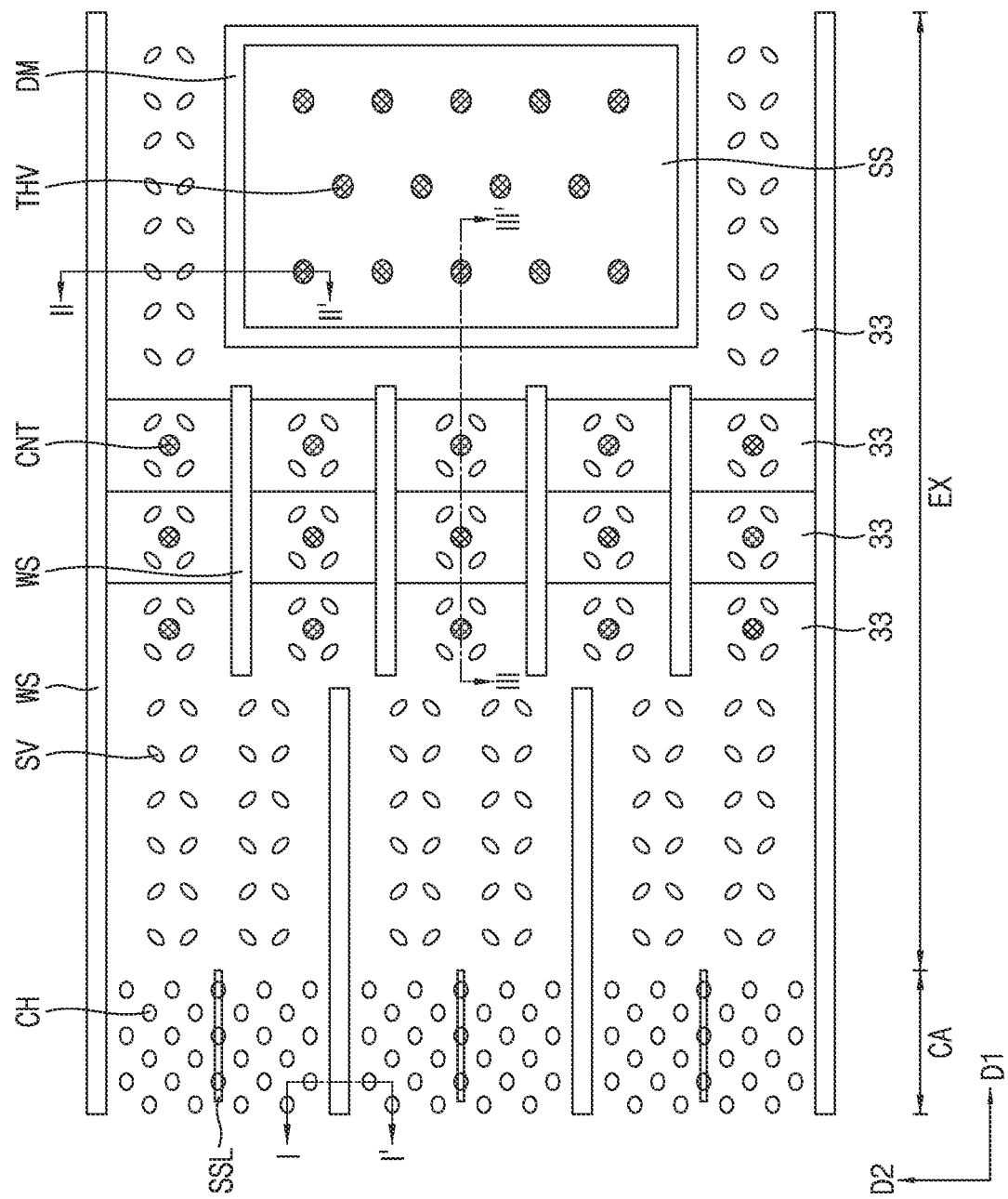
FIG. 5 is a schematic layout of a semiconductor device according to an example embodiment of the disclosure.

FIG. 5 is a schematic layout of a semiconductor device according to an example embodiment of the disclosure.

Referring to FIG. 5, the semiconductor device may include a cell area CA formed with memory cells, and an extension area EX for connecting the memory cells to a wiring. In FIG. 1, only portions of the cell area CA and the extension area EX are shown. Although the extension area EX is shown as being positioned at one side of the cell area CA, the extension area EX may be positioned at opposite sides of the cell area CA.

The semiconductor device may include gate electrodes 33, string selection line separation patterns SSL, channel structures CH, supporters SV, gate contact plugs CNT, word line separation layers WS, a dam structure DM, a mold structure SS, and through hole vias (THVs) THV.

The gate electrodes 33 may have a plate shape extending in a first direction D1 and a second direction D2. The gate electrodes 33 may extend from the cell area CA into the extension area EX in the second direction D2. The gate electrodes 33 may have different lengths in the second direction D2.

The string selection line separation patterns SSL may be positioned in the cell area CA. The string selection line separation patterns SSL may extend in the second direction D2. The string selection line separation patterns SSL may physical and materially isolate a part of gate electrodes 33, which is positioned at an upper side from among the gate electrodes 33.

The channel structures CH may be positioned in the cell area CA. The channel structures CH may have a circular shape when viewed in a top view. The channel structures CH are arranged in the first direction D1 and, as such, a pad row may be defined, and a plurality of pad rows may be arranged in parallel in the second direction D2 perpendicularly intersecting the first direction D1. The channel structures CH may be arranged in a hexagonal dense lattice form or a zigzag form.

The supporters SV may be positioned in the extension area EX. When viewed in a top view, the supporters SV may have a circular shape, an oval shape, an elbow shape, or a bar shape. The supporters SV may be arranged in a quadrangular lattice form. The supporters SV may have a lower pattern density than the channel structures CH. The gate contact plugs CNT may be positioned in the extension area EX. The supporters SV may be positioned to surround the gate contact plug CNT. For example, one gate contact plug CNT may be positioned at a center of four adjacent supporters SV.

The word line separation layers WS may extend in the second direction D2. The word line separation layers WS may be positioned in parallel under the condition that the channel structures CH, the supporters SV and the gate contact plugs CNT are interposed between the word line separation layers WS. A part of the word line separation layers WS may extend from the cell area CA into the extension area EX. A part of the word line separation layers WS may be positioned in the extension area EX, but may not be positioned in the cell area CA.

The dam structure DM may be positioned in the extension area EX. When viewed in a top view, the dam structure DM may have a quadrangular ring shape. The mold structure SS and the THVs THV may be positioned inside the dam structure DM. The dam structure DM may surround the mold structure SS and the THVs THV. The mold structure SS may be spaced apart from the gate electrodes 33 by the dam structure DM. The mold structure SS may surround the THVs THV.

Figure 6:
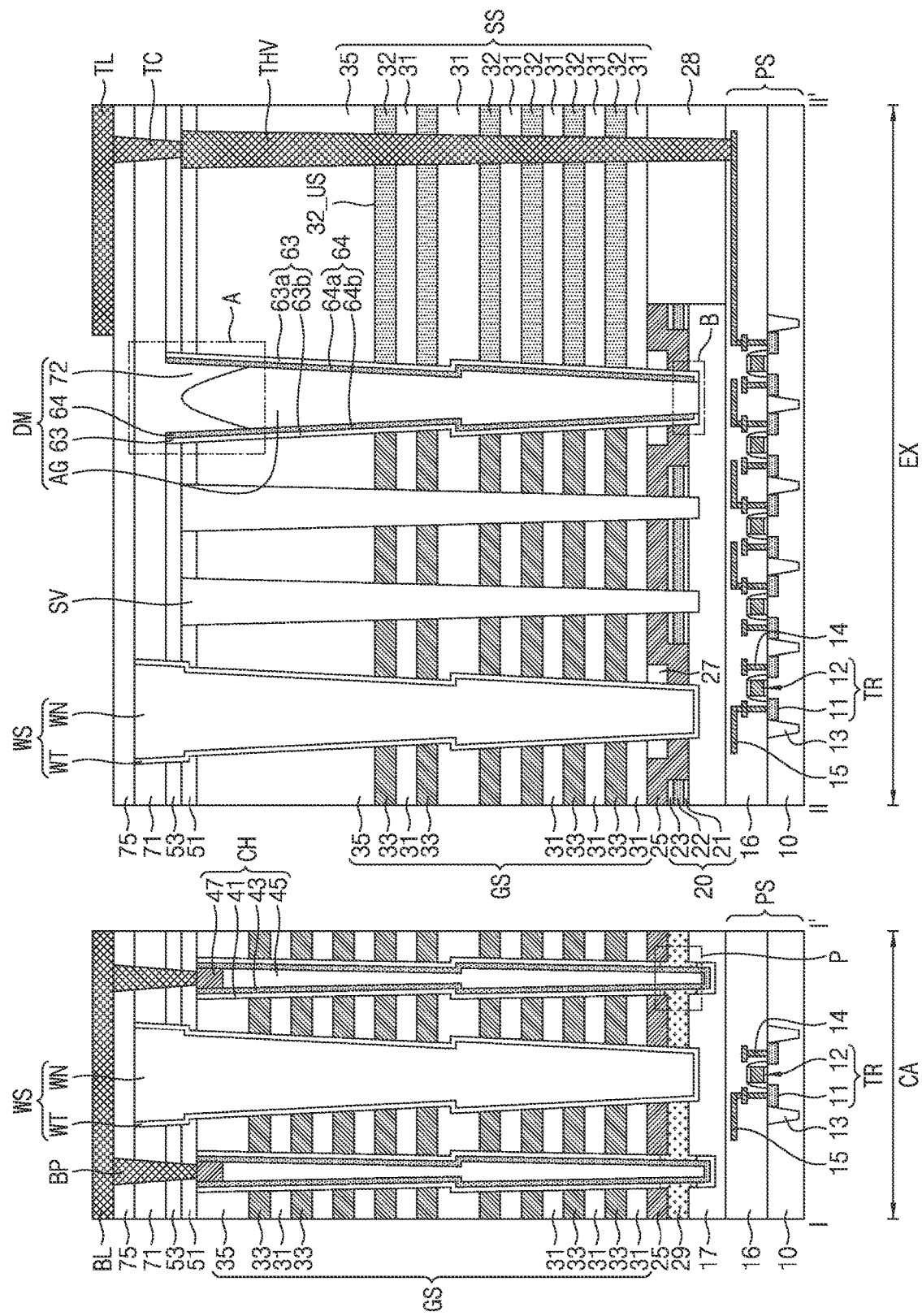
FIG. 6 is cross-sectional views taken along lines I-I' and II-II' in FIG. 5.
Figure 9:
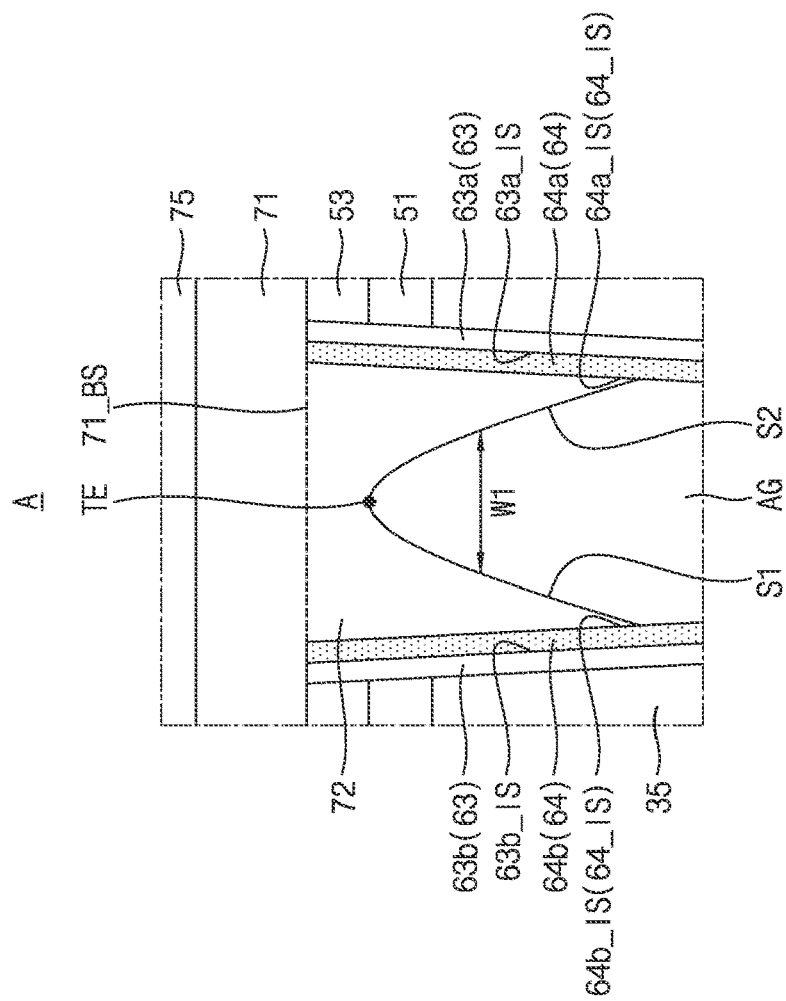
FIG. 9 is an enlarged view of a portion A of FIG. 6.
Figure 8:
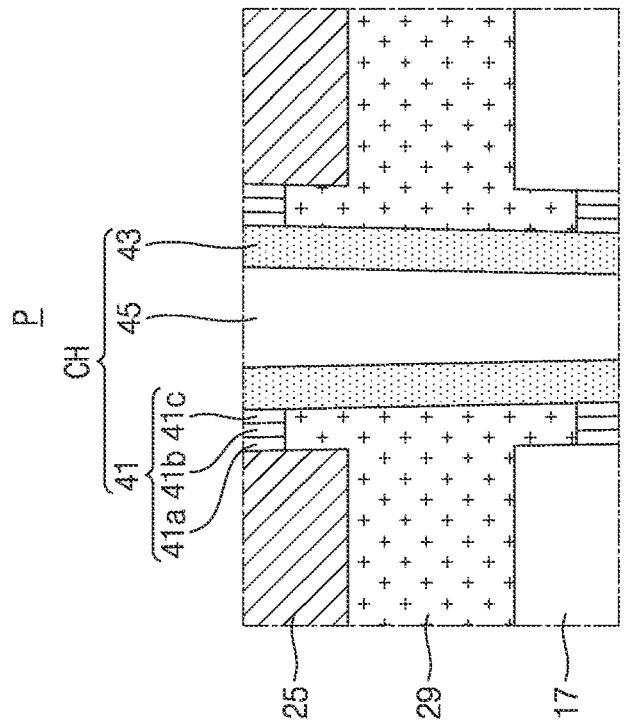
FIG. 8 is an enlarged view of a portion P of FIG. 6.
Figure 10:
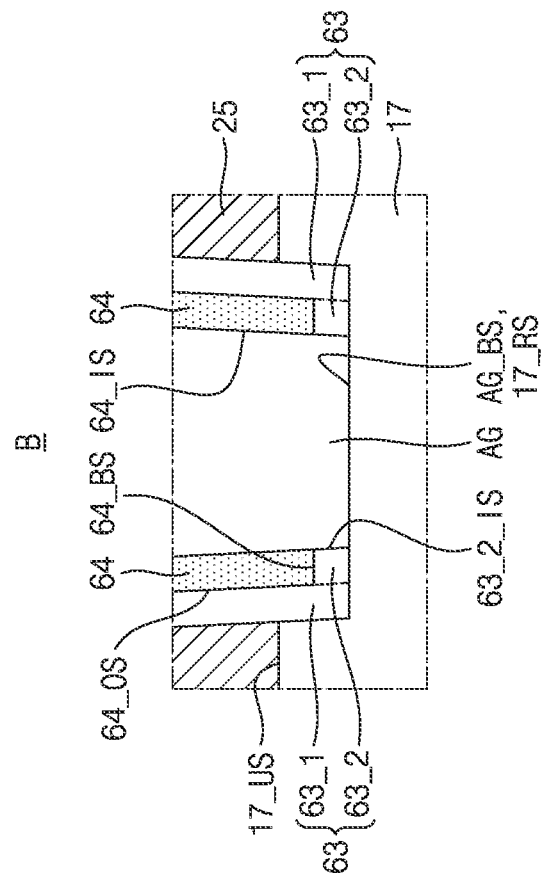
FIG. 10 is an enlarged view of a portion B of FIG. 6.

FIG. 6 is cross-sectional views taken along lines I-I' and II-II' in FIG. 5. FIG. 7 is a cross-sectional view taken along line of FIG. 5. FIG. 8 is an enlarged view of a portion P of FIG. 6. FIG. 9 is an enlarged view of a portion A of FIG. 6. FIG. 10 is an enlarged view of a portion B of FIG. 6.

Referring to FIGS. 5 to 7, the semiconductor device may include a peripheral circuit structure PS, source structures (including a source conductive layer 29, a support conductive layer 25, a connecting mold layer 20, and a buffer insulating layer 27), a buried insulating layer 28, a gate stack structure GS, the mold structure SS, the channel structure CH, a first upper insulating layer 51, a second upper insulating layer 53, the supporters SV, the THVs THV, the dam structure DM, an upper supporter layer 71, the word line separation layers WS, a third upper insulating layer 75, a bit line BL, a bit line contact plug BP, a THV contact plug TC, an top line TL, and a gate contact plug CNT.

The peripheral circuit structure PS may include a substrate 10, a transistor TR, an element isolation layer 13, a peripheral circuit contact 14, a peripheral circuit wiring 15, and a lower insulating layer 16.

The substrate 10 may include a silicon wafer. In an embodiment, the substrate 10 may include an epitaxially-grown material layer such as a silicon layer, a silicon germanium layer, or a silicon carbide layer. In an embodiment, the substrate 10 may include a silicon-on-insulator (SOI).

The transistor TR may include a channel region and an impurity region 11 which are formed in an active region defined by the element isolation layer 13. The transistor TR may include a gate structure 12 formed on the substrate 10. The transistor TR may correspond to the peripheral circuit structure described with reference to FIG. 1. The peripheral circuit contact 14 and the peripheral circuit wiring 15 may be electrically connected to the transistor TR. The lower insulating layer 16 may cover the element isolation layer 13, the transistor TR, the peripheral circuit contact 14 and the peripheral circuit wiring 15. The lower insulating layer 16 may include a plurality of stacked insulating films. For example, the lower insulating film 16 may include at least one of silicon oxide, silicon nitride, low-k dielectrics, and a combination thereof.

A semiconductor layer 17 may be positioned on the peripheral circuit structure PS. The semiconductor layer 17 may be a semiconductor substrate including a semiconductor material. The semiconductor layer 17 may include at least one of silicon (Si), germanium (Ge), silicon germanium (SiGe), gallium arsenide (GaAs), indium gallium arsenide (InGaAs), aluminum gallium arsenide (AlGaAs), or a combination thereof. The semiconductor layer 17 may include a semiconductor doped with impurities and/or an intrinsic semiconductor not doped with impurities. The semiconductor layer 17 may have a crystalline structure including at least one selected from a monocrystalline structure, an amorphous structure, and a polycrystalline structure.

The source structures may be positioned on the semiconductor layer 17. The source structures may include a source conductive layer 29, a support conductive layer 25, a connecting mold layer 20, and a buffer insulating layer 27. The source conductive layer 29 may be positioned in the cell area CA. The source conductive layer 29 may be positioned on the semiconductor layer 17. The source conductive layer 29 may include a semiconductor material doped with impurities.

The connecting mold layer 20 may be positioned in the extension area EX. The connecting mold layer 20 may include a first connecting insulating layer 21, a second connecting insulating layer 22 and a third connecting insulating layer 23 which are sequentially stacked on the semiconductor layer 17. For example, the first connecting insulating layer 21 and the third connecting insulating layer 23 may include silicon oxide, and the second connecting insulating layer 22 may include silicon nitride. The connecting mold layer 20 may cover a portion of the semiconductor layer 17, and may include an opening exposing a portion of the semiconductor layer 17.

The support conductive layer 25 may be positioned on the source conductive layer 29 and the connecting mold layer 20. The support conductive layer 25 may be positioned in the cell area CA and the extension area EX. The support conductive layer 25 may cover the source conductive layer 29 and the connecting mold layer 20, and may extend into the opening of the connecting mold layer 20, thereby covering the semiconductor layer 17 exposed by the opening. The support conductive layer 25 may include a semiconductor doped with impurities and/or an intrinsic semiconductor not doped with impurities. The support conductive layer 25 may have a recess at a portion thereof overlapping with the opening. The buffer insulating layer 27 may be positioned in the recess. A top surface of the buffer insulating layer 27 may be coplanar with a top surface of the support conductive layer 25. For example, the buffer insulating layer 27 may include silicon oxide.

The buried insulating layer 28 may be positioned on the peripheral circuit structure PS. The buried insulating layer 28 may be positioned in the extension area EX. The semiconductor layer 17, the connecting mold layer 20, and the support conductive layer 25 may have a trench exposing a portion of a top surface of the lower insulating layer 16 in the extension area EX, and the buried insulating layer 28 may be positioned on the lower insulating layer 16 in the trench. The buried insulating layer 28 may contact a side wall of each of the semiconductor layer 17, the connecting mold layer 20 and the support conductive layer 25 which is exposed by the trench. A top surface of the buried insulating layer 28 may be coplanar with the top surface of the support conductive layer 25 and the top surface of the buffer insulating layer 27. When viewed in a top view, the buried insulating layer 28 may have a quadrangular shape. When viewed in a top view, the buried insulating layer 28 may be positioned inside the dam structure DM and, as such, may be surrounded by the dam structure DM. For example, the buried insulating layer 28 may include silicon oxide.

The gate stack structure GS may be positioned on the support conductive layer 25 and the buffer insulating layer 27. The gate stack structure GS may be positioned in both the cell area CA and the extension area EX. The gate stack structure GS may be positioned outside the dam structure DM. The gate stack structure GS may surround the dam structure DM and the mold structure SS. The gate stack structure GS may include gate insulating layers 31 and gate electrodes 33 which are alternately and repeatedly stacked. The gate stack structure GS may have a staircase structure in the extension area EX. The gate insulating layers 31 and the gate electrodes 33 may be paired, and pairs thereof extend by different lengths in the second direction D2, respectively, and, as such, may provide pads PAD having a stepped structure. For example, the gate electrodes 33 may include at least one of a doped semiconductor, metal such as tungsten, copper, etc., a conductive metal nitride such as titanium nitride and tantalum nitride, or a transition metal such as titanium and tantalum. For example, the gate insulating layers 31 may include silicon oxide and/or low-k dielectrics. The gate stack structure GS may include a mold layer 35 covering the gate insulating layers 31 and the gate electrodes 33. For example, the mold layer 35 may include silicon oxide.

The mold structure SS may be positioned on the buried insulating layer 28. The mold structure SS may be positioned in the extension area EX. The mold structure SS may be positioned inside the dam structure DM. The dam structure DM may surround the mold structure SS. The mold structure SS may vertically overlap with the buried insulating layer 28. The mold structure SS may vertically overlap with a portion, which is positioned inside the dam structure DM, of each of the semiconductor layer 17, the connecting mold layer 20, the support conductive layer 25 and the buffer insulating layer 27. The mold structure SS may be isolated from the gate stack structure GS by the dam structure DM. The mold structure SS may include gate insulating layers 31, sacrificial layers 32 and a mold layer 35. The gate insulating layers 31 and the sacrificial layers 32 may be alternately and repeatedly stacked. The mold layer 35 may be positioned on the gate insulating layers 31 and the sacrificial layers 32. For example, the gate insulating layers 31 and the mold layer 35 may include silicon oxide. For example, the sacrificial layers 32 may include silicon nitride.

The channel structures CH may be positioned in the cell area CA. The channel structures CH may vertically extend with reference to a top surface of the substrate 10 and extend through the source conductive layer 29, the support conductive layer 25 and the gate stack structure GS. A portion of a lower section of each channel structure CH may extend into the semiconductor layer 17. The channel structures CH may be electrically connected to the source conductive layer 29.

Referring to FIGS. 6 and 8, each channel structure CH may include an information storage pattern 41, a channel pattern 43, a buried insulating pattern 45, and a conductive pad 47. The channel pattern 43 may be positioned inside the information storage pattern 41, and the buried storage pattern 45 may be positioned inside the channel pattern 43. The information storage pattern 41 may form a side surface of the channel structure CH and contact the gate stack structure GS. The conductive pad 47 may be positioned on the buried insulating pattern 45 inside the channel pattern 43.

The information storage pattern 41 may include a blocking layer 41a, a charge storage layer 41b, and a tunnel insulating layer 41c. The charge storage layer 41b may be positioned inside the blocking layer 41a, and the tunnel insulating layer 41c may be positioned inside the charge storage layer 41b. The blocking layer 41a and the tunnel insulating layer 41c may include oxide, and the charge storage layer 41b may include nitride. The channel pattern 43 may include a semiconductor material such as silicon, germanium or a mixture thereof. The buried insulating pattern 45 may include silicon oxide, silicon nitride, silicon oxynitride, or a combination thereof. The conductive pad 47 may include a semiconductor material doped with impurities or a conductive material.

The source conductive layer 29 may directly contact a side surface of the channel pattern 43 and extend through the information storage pattern 41. The source conductive layer 29 may extend between the support conductive layer 25 and the channel pattern 43. The source conductive layer 29 may extend between the semiconductor layer 17 and the channel pattern 43.

Referring to FIGS. 5 to 7, a first upper insulating layer 51 and a second upper insulating layer 53 may be positioned on the gate stack structure GS, the mold structure SS and the channel structures CH. The first upper insulating layer 51 and the second upper insulating layer 53 may be positioned between the gate stack structure GS and the upper supporter layer 71. The first upper insulating layer 51 and the second upper insulating layer 53 may be positioned between the mold structure SS and the upper supporter layer 71. The first upper insulating layer 51 may directly contact the gate stack structure GS and the mold structure SS, and the second upper insulating layer 53 may be positioned on the first upper insulating layer 51. For example, the first upper insulating layer 51 and the second upper insulating layer 53 may include silicon oxide, silicon nitride, silicon oxynitride, low-k dielectrics, or a combination thereof.

The supporters SV may be positioned outside the dam structure DM in the extension area EX. The supporters SV may be positioned among the word line separation layers WS. The supporters SV may be positioned between the word line separation layers WS and the dam structure DM. The supporters SV may vertically extend with reference to the top surface of the substrate 10 and extend through the connecting mold layer 20, the support conductive layer 25, the gate stack structures GS and the first upper insulating layer 51. For example, the supporters SV may include silicon oxide.

The THVs THV may be positioned inside the dam structure DM in the extension area EX. The THVs THV may vertically extend with reference to the top surface of the substrate 10 and extend through the buried insulating layer 28, the mold structure SS and the first upper insulating layer 51. The THVs THV may be electrically connected to the peripheral circuit wiring 15 and extend into the lower insulating layer 16. For example, the THVs THV may be directly connected to the peripheral circuit wiring 15. The THVs THV may include a conductive material. For example, the THVs THV may include metal nitride such as nitride titanium and/or metal such as tungsten.

Referring to FIGS. 5 to 7 and FIG. 9, the dam structure DM may be positioned in the extension area EX. The dam structure DM may be interposed between the gate stack structure GS and the mold structure SS. The dam structure DM may extend through the buffer insulating layer 27 and the support conductive layer 25. The dam structure DM may extend through the first upper insulating layer 51 and the second upper insulating layer 53.

The dam structure DM may include spacers 63 and 64, a lower supporter layer 72, and an air gap AG. The spacers 63 and 64 may extend between the gate stack structure GS and the mold structure SS. The spacers 63 and 64 may extend through the buffer insulating layer 27 and the support conductive layer 25. The spacers 63 and 64 may extend through the first upper insulating layer 51 and the second upper insulating layer 53. In an embodiment, a portion of a lower section of each of the spacers 63 and 64 may extend into the semiconductor layer 17.

The spacers 63 and 64 may include a first spacer 63 and a second spacer 64. The first spacer 63 may vertically extend between the gate stack structure GS and the mold structure SS and through the buffer insulating layer 27 and the support conductive layer 25. The first spacer 63 may extend through the first upper insulating layer 51 and the second upper insulating layer 53. The first spacer 63 may contact inner side walls of the gate stack structure GS and the mold structure SS. The first spacer 63 may contact inner side walls of the buffer insulating layer 27 and the support conductive layer 25. A portion of a lower section of the first spacer 63 may extend into the semiconductor layer 17. For example, the first spacer 63 may include oxide.

The first spacer 63 may include a first inner spacer 63a and a first outer spacer 63b. The first inner spacer 63a may contact the inner side wall of the mold structure SS, and the first outer spacer 63b may contact the inner side wall of the gate stack structure GS. When viewed in a top view, the first inner spacer 63a may be positioned inside the first outer spacer 63b. The first outer spacer 63b may be spaced apart from the first inner spacer 63a, and may surround the first inner spacer 63a when viewed in a top view.

The second spacer 64 may be positioned inside the first inner spacer 63. "Inside the first spacer 63" may mean "between the first outer spacer 63b and the first inner spacer 63a". The second spacer 64 may cover an inner side wall of the first spacer 63. The second spacer 64 may extend between the gate stack structure GS and the mold structure SS. The second spacer 64 may extend through the buffer insulating layer 27 and the support conductive layer 25. The second spacer 64 may extend through the first upper insulating layer 51 and the second upper insulating layer 53. For example, the second spacer 64 may include nitride.

The second spacer 64 may include a second inner spacer 64a and a second outer spacer 64b. The second inner spacer 64a may cover an inner side wall 63a_IS of the first inner spacer 63a. The second outer spacer 64b may cover an inner side wall 63b_IS of the first outer spacer 63b. The second outer spacer 64b and the second inner spacer 64a may be spaced apart from each other. When viewed in a top view, the second outer spacer 64b may surround the second inner spacer 64a.

The lower supporter layer 72 may be positioned at an upper section of the dam structure DM. The lower supporter layer 72 may be positioned inside the second spacer 64. "Inside the second spacer 64" may mean "between the second outer spacer 64b and the second inner spacer 64a". The lower supporter layer 72 may extend through the first upper insulating layer 51 and the second upper insulating layer 53. The lower supporter layer 72 may cover portions of upper sections of inner side walls 64a_IS and 64b_IS of the second spacer 64. The lower supporter layer 72 may be positioned at a lower level than top ends of the first spacer 63 and the second spacer 64. The lower supporter layer 72 may be positioned at a lower level than a top surface of the second upper insulating layer 53. For example, the lower supporter layer 72 may include oxide.

The air gap AG may be positioned inside the second spacer 64. That is, the air gap AG may be positioned between the second inner spacer 64a and the second outer spacer 64b. The air gap AG may be defined by the semiconductor layer 17, the first spacer 63, the second spacer 64, and the lower supporter layer 72. The air gap AG may be an empty space or void enclosed by the semiconductor layer 17, the first spacer 63, the second spacer 64, and the lower supporter layer 72. The air gap AG may vertically extend along a length within an inside of the second spacer 64. The air gap AG may extend through the support conductive layer 25 and the buffer insulating layer 27 between the gate stack structure GS and the mold structure SS. In an embodiment, the air gap AG may extend through the first upper insulating layer 51. In an embodiment, the air gap AG may extend into the second upper insulating layer 53.

The upper supporter layer 71 may be positioned on the second upper insulating layer 53 and the dam structure DM. The upper supporter layer 71 may be positioned on the gate stack structure GS, the mold structure SS, the channel structures CH, and the THVs THV. The upper supporter layer 71 may cover a top surface of the second upper insulating layer 53. The upper supporter layer 71 may be connected to the lower supporter layer 72. The upper supporter layer 71 may be formed integrally with the lower supporter layer 72. The upper supporter layer 71 and the lower supporter layer 72, which are integrated with each other, may be referred to as "supporter layers 71 and 72". The lower supporter layer 72 may extend from a bottom surface of the upper supporter layer 71 toward the substrate 10. The upper supporter layer 71 may include the same material as the lower supporter layer 72. For example, the upper supporter layer 71 may include oxide.

The word line separation layers WS may vertically extend through the source conductive layer 29, the support conductive layer 25, the gate stack structure GS, the first upper insulating layer 51, the second upper insulating layer 53, and the upper supporter layer 71 in the cell area CA. The word line separation layers WS may vertically extend through the support conductive layer 25, the buffer insulating layer 27, the gate stack structure GS, the first upper insulating layer 51, the second upper insulating layer 53, and the upper supporter layer 71 in the extension area EX. The word line separation layers WS may include a first separation layer WT and a second separation layer WN. The first separation layer WT may directly contact the semiconductor layer 17, the source conductive layer 29, the support conductive layer 25, the gate stack structure GS, the first upper insulating layer 51, the second upper insulating layer 53, and the upper supporter layer 71. The second separation layer WN may be positioned inside the first separation layer WT. For example, the first separation layer WT may include aluminum oxide, and the second separation layer WN may include silicon oxide.

The third upper insulating layer 75 may be positioned on the upper supporter layer 71 and the word line separation layers WS. For example, the third upper insulating layer 75 may include at least one of silicon oxide, silicon oxynitride, and low-k dielectrics. The bit line BL may be positioned on the third upper insulating layer 75 in the cell area CA. The bit line BL may extend in the second direction D2. The bit line contact plug BP may interconnect the channel structures CH and the bit line BL. The bit line contact plug BP may extend through the first upper insulating layer 51, the second upper insulating layer 53, the upper supporter layer 71, and the third upper insulating layer 75. The top line TL may be positioned on the third upper insulating layer 75 in the extension area EX. The THV contact plug TC may electrically interconnect the THVs THV and the top line TL and extend through the second upper insulating layer 53, the upper supporter layer 71, and the third upper insulating layer 75. The peripheral circuit wiring 15 and the top line TL may be electrically interconnected through the THVs THV and the THV contact plug TC. The gate contact plug CNT may be connected to the pad PAD of the gate stack structure GS in the extension area EX. The gate contact plug CNT may be connected to the pad PAD and vertically extend through the mold layer 35, the first upper insulating layer 51, the second upper insulating layer 53, and the upper supporter layer 71.

Referring to FIGS. 6 and 9, the lower supporter layer 72 may extend from a bottom surface 71_BS of the upper supporter layer 71 toward the substrate 10, and may extend into the inside of the second spacer 64. That is, the lower supporter layer 72 may extend between the second outer spacer 64b and the second inner spacer 64a. The lower supporter layer 72 may cover at least a portion of each of inner side walls 64a_IS and 64b_IS of the second spacer 64. For example, the lower supporter layer 72 may cover a portion of the inner side wall 64b_IS of the second outer spacer 64b and a portion of the inner side wall 64a_IS of the second inner spacer 64a.

In an embodiment, the lower supporter layer 72 may have a bottom surface S1-S2 having an inverted V shape or an inverted U shape, and the bottom surface S1-S2 of the lower supporter layer 72 may include a first inclined surface S1 and a second inclined surface S2. For example, the first inclined surface S1 and the second inclined surface S2 may be curved. The first inclined surface S1 and the second inclined surface S2 may be interconnected, and a vertex TE may be formed at a point where the first inclined surface S1 and the second inclined surface S2 are interconnected. The level of a bottom end of the lower supporter layer 72 may be higher than the level of an upper surface 32_US of an uppermost one of the sacrificial layers 32 of the mold structure SS. At least a portion of the air gap AG may extend into the lower supporter layer 72. A portion of an upper section of the air gap AG may extend into the lower supporter layer 72 and, as such, may be positioned between the first inclined surface S1 and the second inclined surface S2. A width W1 of the portion of the upper section of the air gap AG positioned between the first inclined surface S1 and the second inclined surface S2 may be gradually reduced as the portion of the upper section extends upwards. A side of the air gap AG may be defined by the inner side walls 64a_IS and 64b_IS of the second spacer 64 exposed by the lower supporter layer 72, and a top end of the air gap AG may be defined by the first inclined surface S1 and the second inclined surface S2 of the lower supporter layer 72. A top end of the air gap AG may be defined by the vertex TE of the lower supporter layer 72.

Referring to FIGS. 6 and 10, the first spacer 63 may include a first section 63_1 contacting an outer side wall 64_OS of the second spacer 64 and a second section 63_2 contacting a bottom end 64_BS of the second spacer 64. The second section 63_2 may horizontally extend from an inner side wall of a lower portion of the first section 63_1. The second section 63_2 may extend from the first section 63_1 inwardly of the first spacer 63. The first section 63_1 and the second section 63_2 may be interconnected and, as such, may form an L shape.

Referring to FIGS. 6, 9 and 10, the air gap AG may expose a portion of the inner side wall 64_IS of the second spacer 64. For example, the air gap AG may expose an inner side wall 63_2_IS of the second section 63_2. The air gap AG may expose a portion of the semiconductor layer 17. The air gap AG may be defined by the inner side wall 63_2_IS of the second section 63_2, the portion of the inner side wall 64_IS of the second spacer 64, the portion of the semiconductor layer 17, and the bottom surface S1-S2 of the lower supporter layer 72. In an embodiment, a portion of a lower section of the air gap AG may extend into the semiconductor layer 17. A portion of the semiconductor layer 17 may be recessed by the air gap AG. An upper surface of the semiconductor layer 17 exposed by the air gap AG may be referred to as a "recessed surface 17_RS". A bottom surface AG BS of the air gap AG may be defined by the recessed surface 17_RS of the semiconductor layer 17. The level of the bottom surface AG BS of the air gap AG may be lower than the level of an upper surface 17_US of the semiconductor layer 17.

Figure 11:
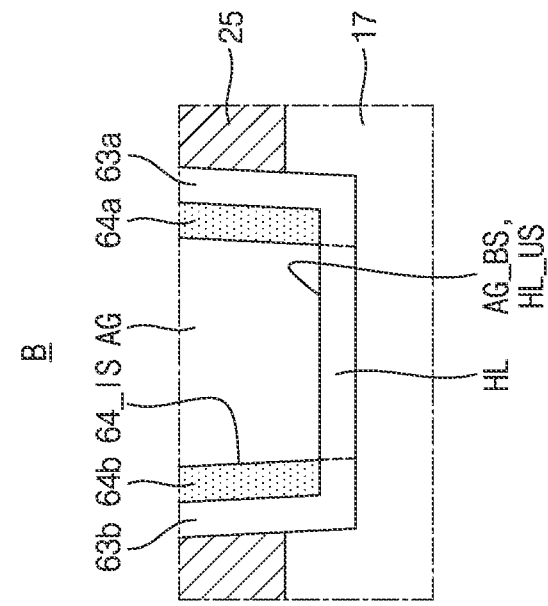
FIG. 11 is an enlarged view of the portion B of FIG. 6 according to an example embodiment of the disclosure.

FIG. 11 is an enlarged view of the portion B of FIG. 6 according to an example embodiment of the disclosure.

Referring to FIGS. 6, 9 and 11, in an embodiment, the dam structure DM may further include a horizontal layer HL interconnecting the first outer spacer 63b and the first inner spacer 63a. The horizontal layer HL may cover the semiconductor layer 17. The horizontal layer HL may separate the semiconductor layer 17 and the air gap AG from each other. The air gap AG may be defined by a portion of the inner side wall 64_IS of the second spacer 64, the bottom surface S1-S2 of the lower supporter layer 72, and an upper surface HL_US of the horizontal layer HL. The bottom surface AG BS of the air gap AG may be defined by the upper surface HL_US of the horizontal layer HL.

FIG. 12 is an enlarged view of the portion A of FIG. 6 according to an example embodiment of the disclosure.

Referring to FIG. 12, in an embodiment, the lower supporter layer 72 may include nitride. The lower supporter layer 72 may include the same material as the second spacer 64. The lower supporter layer 72 may include a material different from that of the upper supporter layer 71. Other characteristics of the lower supporter layer 72, except for the material included in the lower supporter layer 72, that is, the shape, arrangement, etc. of the lower supporter layer 72, may be the same as the above-described characteristics of the lower supporter layer 72.

Figure 13:
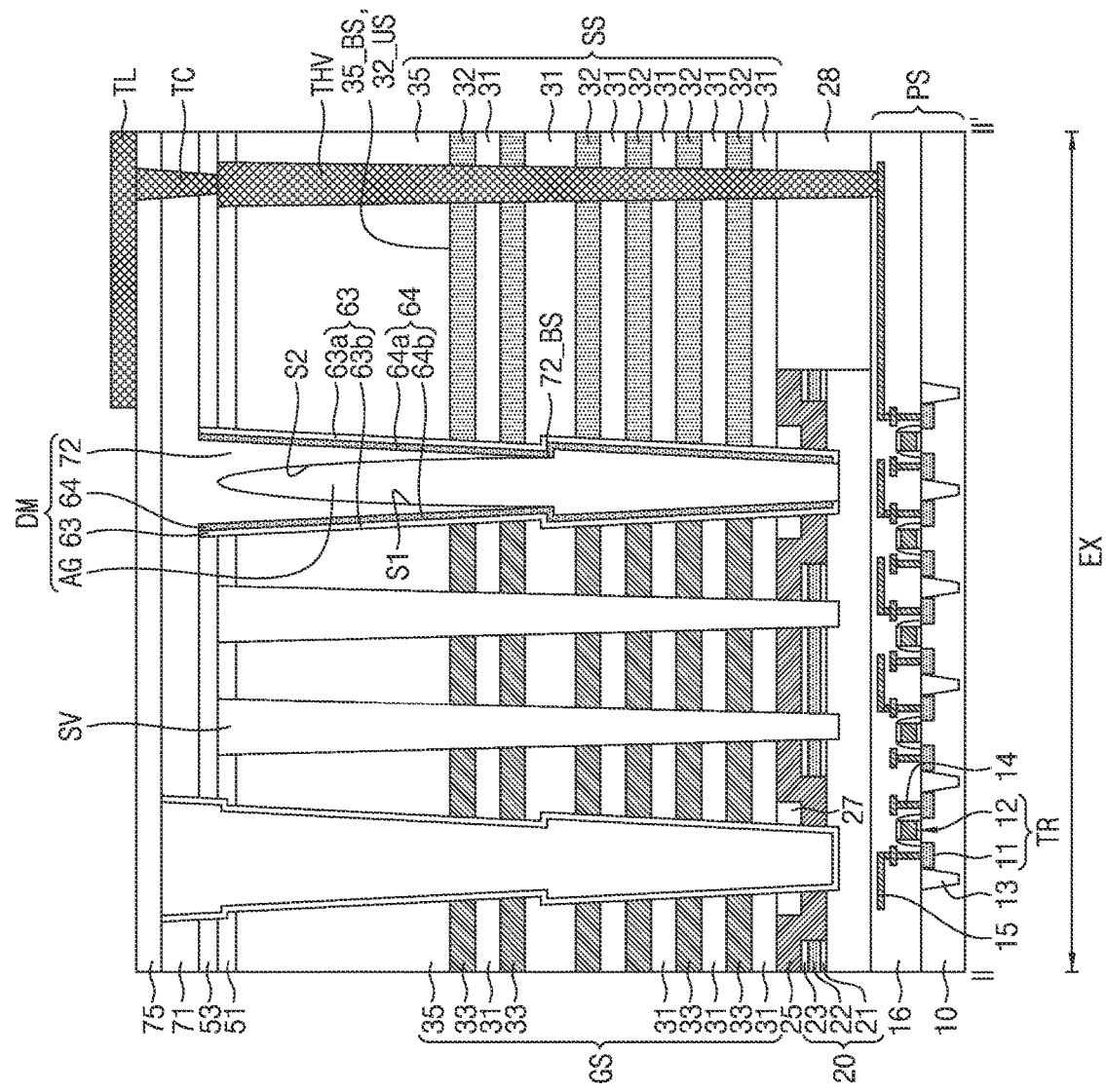
FIG. 13 is a cross-sectional view taken along line II-IF in FIG. 5 in accordance with an example embodiment of the disclosure.

FIG. 13 is a cross-sectional view taken along line II-IF in FIG. 5 in accordance with an example embodiment of the disclosure.

Referring to FIG. 13, each of the first inclined surface S1 and the second inclined surface S2 of the lower supporter layer 72 may extend downwards to a middle section of the dam structure DM or below. The lower supporter layer 72 may not only cover an upper section of the inner side wall of the second spacer 64, but also cover a middle section of the inner side wall of the second spacer 64. The inner side wall of the second spacer 64 may be exposed only at at least a portion of the middle section thereof and a lower section thereof. In an embodiment, the level of the bottom end 72_BS of the lower supporter layer 72 may be equal to or lower than the level of a bottom surface 35_BS of the mold layer 35 adjacent to the dam structure DM. That is, the level of the bottom end 72_BS of the lower supporter layer 72 may be equal to or lower than the level of the upper surface 32 US of the uppermost sacrificial layer 32 of the mold structure SS. At least a portion of a middle section of the air gap AG and the upper section of the air gap AG may extend into the lower supporter layer 72. At least a portion of the middle section of the air gap AG and the upper section of the air gap AG may be positioned between the first inclined surface S1 and the second inclined surface S2 of the lower supporter layer 72.

Figure 14:
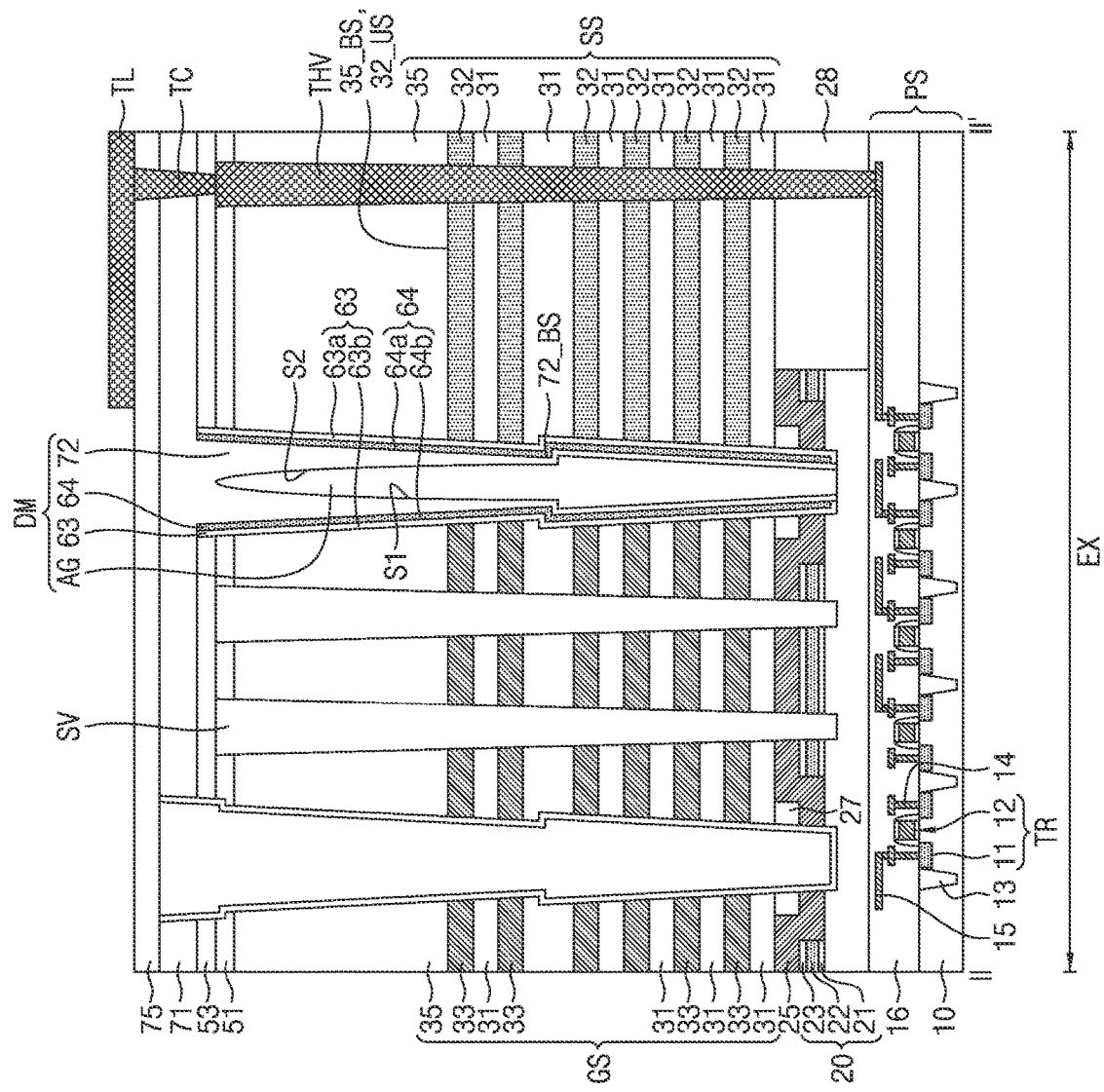
FIG. 14 is a cross-sectional view taken along line II-IF in FIG. 5 in accordance with an example embodiment of the disclosure.

FIG. 14 is a cross-sectional view taken along line II-IF in FIG. 5 in accordance with an example embodiment of the disclosure.

Referring to FIG. 14, each of the first inclined surface S1 and the second inclined surface S2 of the lower supporter layer 72 may extend to a bottom end of the dam structure DM. For example, each of the first inclined surface S1 and the second inclined surface S2 may contact the semiconductor layer 17. The lower supporter layer 72 may cover the entirety of the inner side wall of the second spacer 64. The lower supporter layer 72 may expose a portion of the semiconductor layer 17. The lower supporter layer 72 may extend along a profile of the inner side wall of the second spacer 64. The first inclined surface S1 and the second inclined surface S2 of the lower supporter layer 72 may include a shape corresponding to the profile of the inner side wall of the second spacer 64. The second spacer 64 may not be exposed by the lower supporter layer 72. The lower supporter layer 72 may cover a portion of the inner side wall of the first spacer 63 (for example, the inner side wall 63_2_IS of the second section 63_2 of the first spacer 63 described with reference to FIG. 10) exposed without being covered by the second spacer 64. Accordingly, the air gap AG may be defined by the lower supporter layer 72 and the semiconductor layer 17. The side wall and the top end of the air gap AG may be defined by the lower supporter layer 72. The bottom end of the air gap AG may be defined by the semiconductor layer 17.

In an embodiment, although not shown, the lower supporter layer 72 may cover the semiconductor layer 17. For example, the lower supporter layer 72 may cover the recessed surface (cf. "17_RS" in FIG. 10) of the semiconductor layer 17. The semiconductor layer 17 may not be exposed by the lower supporter layer 72. Accordingly, the air gap AG may be defined by the lower supporter layer 72. That is, the air gap AG may be closed by the lower supporter layer 72.

Figure 15:
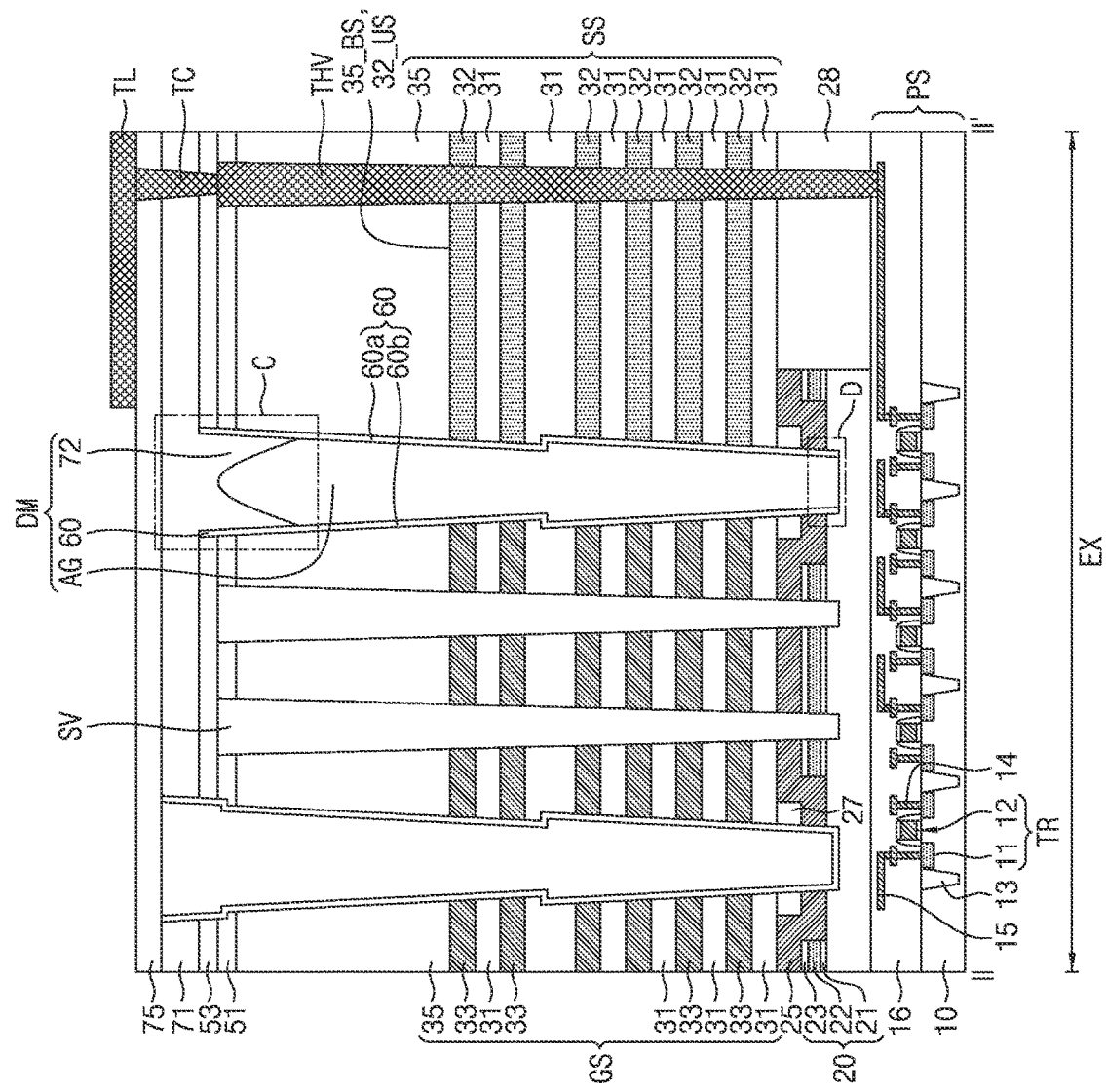
FIG. 15 is a cross-sectional view taken along line II-IF in FIG. 5 in accordance with an example embodiment of the disclosure.
Figure 17:
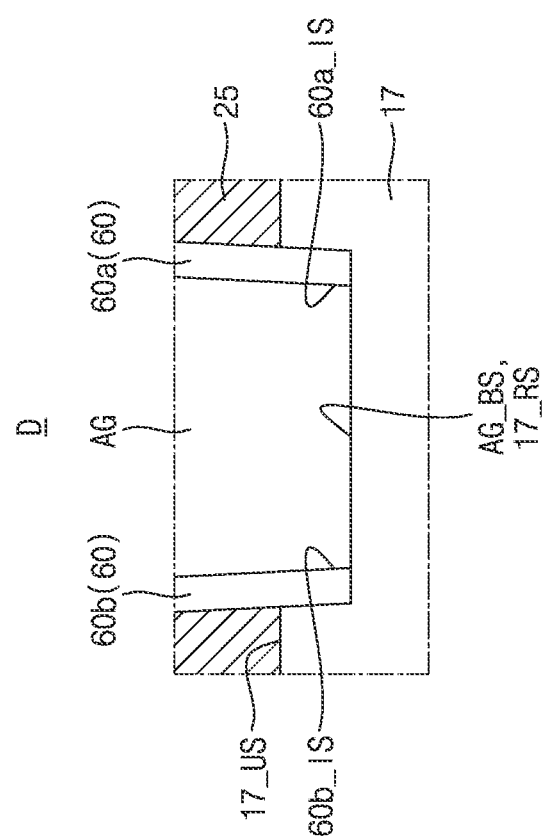
FIG. 17 is an enlarged view of a portion D of FIG. 15.
Figure 16:
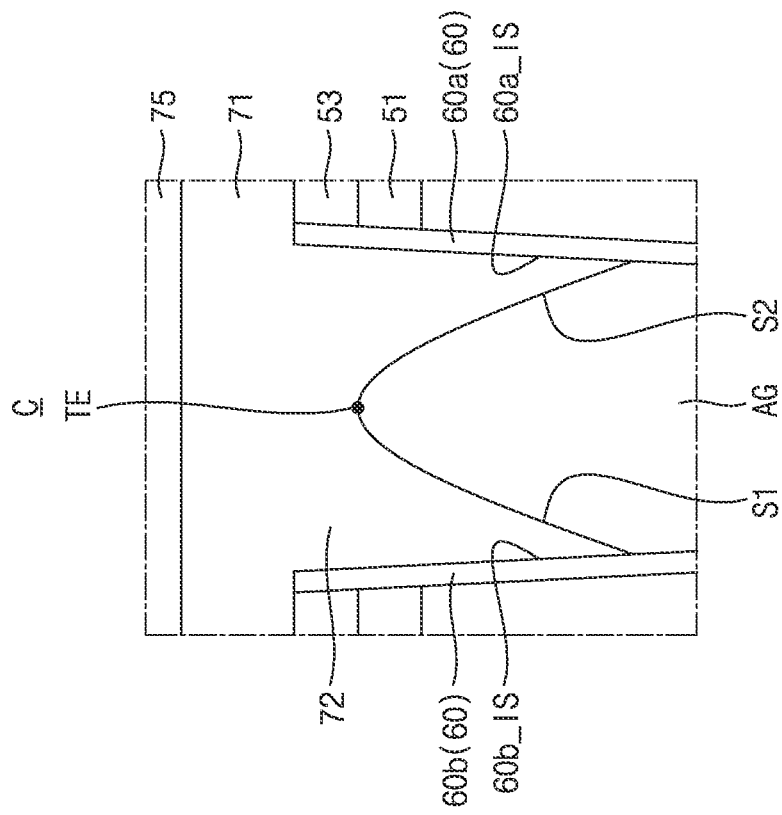
FIG. 16 is an enlarged view of a portion C of FIG. 15.

FIG. 15 is a cross-sectional view taken along line II-IF in FIG. 5 in accordance with an example embodiment of the disclosure. FIG. 16 is an enlarged view of a portion C of FIG. 15. FIG. 17 is an enlarged view of a portion D of FIG. 15.

Referring to FIGS. 15 and 16, a dam structure DM may include a spacer 60 and a lower supporter layer 72. The spacer 60 may include an inner spacer 60a and an outer spacer 60b. The inner spacer 60a may contact a mold structure SS, and the outer spacer 60b may contact a gate stack structure GS. The spacer 60 may include oxide. The lower supporter layer 72 may be positioned inside the spacer 60. That is, the lower supporter layer 72 may be positioned between the inner spacer 60a and the outer spacer 60b. The lower supporter layer 72 may cover a portion of an upper section of an inner side wall 60a_IS of the inner spacer 60a while exposing a portion of the upper section of the inner side wall 60a_IS. The lower supporter layer 72 may cover a portion of an upper section of an inner side wall 60b_IS of the outer spacer 60b while exposing a portion of the upper section of the inner side wall 60b_IS. A bottom surface S1-S2 of the lower supporter layer 72 may include a first inclined surface S1 and a second inclined surface S2. A vertex TE may be formed at a point where the first inclined surface S1 and the second inclined surface S2 are interconnected. An upper section of the air gap AG may extend between the first inclined surface S1 and the second inclined surface S2, and a top end of the air gap AG may be defined by the first inclined surface S1 and the second inclined surface S2. A top end of the air gap AG may be defined by the vertex TE. The lower supporter layer 72 may include oxide. In an embodiment, the lower supporter layer 72 may include the same material as the spacer 60.

Referring to FIGS. 15 to 17, a portion of the air gap AG may extend into a semiconductor layer 17. A portion of the semiconductor layer 17 may be recessed by the air gap AG. The air gap AG may expose the portion of the semiconductor layer 17. An upper surface of the semiconductor layer 17 exposed by the air gap AG may be referred to as a "recessed surface 17_RS". The air gap AG may be defined by the inner side walls 60a_IS and 60b_IS of the spacer 60, the bottom surface S1-S2 of the lower supporter layer 72, and the recessed surface 17_RS of the semiconductor layer 17. A bottom surface AG BS of the air gap AG may be defined by the recessed surface 17_RS of the semiconductor layer 17. The level of the bottom surface AG BS of the air gap AG may be lower than the level of an upper surface 17_US of the semiconductor layer 17.

Figure 18:
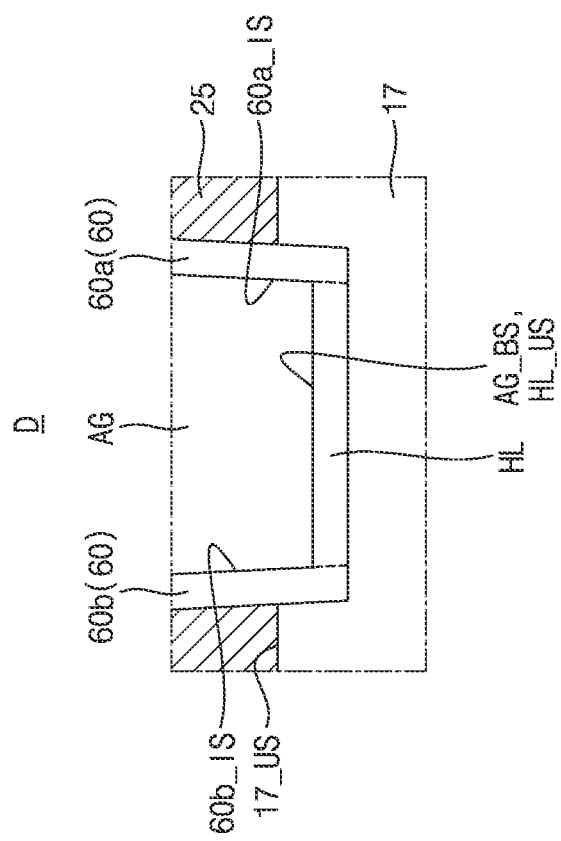
FIG. 18 is an enlarged view of the portion D of FIG. 15 according to an example embodiment of the disclosure.

FIG. 18 is an enlarged view of the portion D of FIG. 15 according to an example embodiment of the disclosure.

Referring to FIGS. 15, 16 and 18, the dam structure DM may further include a horizontal layer HL interconnecting the inner spacer 60a and the outer spacer 60b. The horizontal layer HL may cover the semiconductor layer 17. The horizontal layer HL may separate the semiconductor layer 17 and the air gap AG from each other. The air gap AG may be defined by portions of the inner side walls 60a_IS and 60b_IS of the spacer 60, the bottom surface S1-S2 of the lower supporter layer 72, and an upper surface HL_US of the horizontal layer HL. The bottom surface AG BS of the air gap AG may be defined by the upper surface HL_US of the horizontal layer HL.

Figure 19:
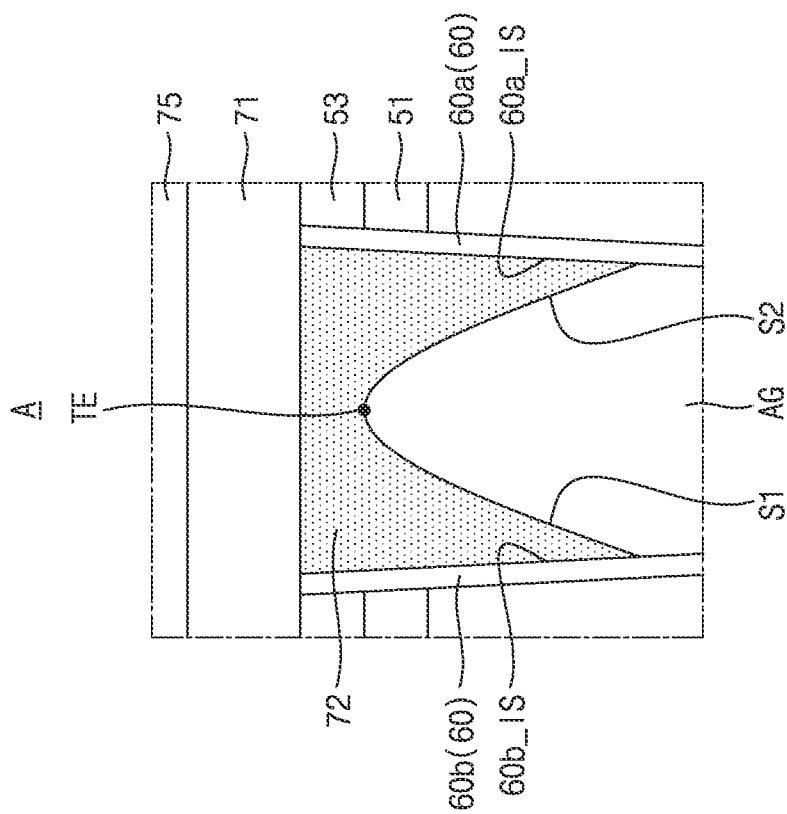
FIG. 19 is an enlarged view of the portion C of FIG. 15 according to an example embodiment of the disclosure.

FIG. 19 is an enlarged view of the portion C of FIG. 15 according to an example embodiment of the disclosure.

Referring to FIG. 19, in an embodiment, the lower supporter layer 72 may include nitride. The lower supporter layer 72 may include a material different from those of the spacer 60 and an upper supporter layer 71. Other characteristics of the lower supporter layer 72, except for the material included in the lower supporter layer 72, that is, the shape, arrangement, etc. of the lower supporter layer 72, may be the same as the characteristics of the lower supporter layer 72 described with reference to FIG. 16.

FIGS. 20 to 29 are cross-sectional views explaining a method for forming a semiconductor device in accordance with an example embodiment of the disclosure.

Referring to FIG. 20, the method may include forming a peripheral circuit structure PS on a substrate 10. Formation of the peripheral circuit structure PS may include forming, on the substrate 10, a transistor TR, an element isolation layer 13, a peripheral circuit contact 14, a peripheral circuit wiring 15 and a lower insulating layer 16. The method may include forming a semiconductor layer 17 on the peripheral circuit structure PS. For example, the semiconductor layer 17 may be a doped polysilicon layer.

The method may include forming a connecting mold layer 20 on the semiconductor layer 17. The connecting mold layer 20 may include a first connecting insulating layer 21, a second connecting insulating layer 22 and a third connecting insulating layer 23 which are sequentially stacked on the semiconductor layer 17. The first connecting insulating layer 21 and the third connecting insulating layer 23 may include silicon oxide, and the second connecting insulating layer 22 may include silicon nitride.

Figure 21:
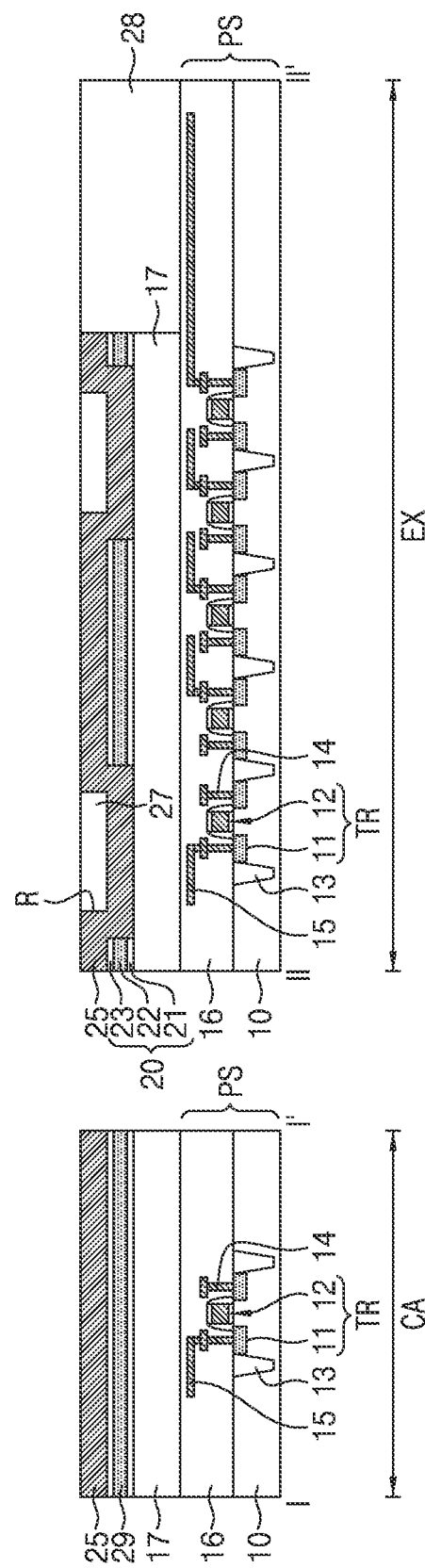

Referring to FIG. 21, the method may include a support conductive layer 25, a buffer insulating layer 27 and a buried insulating layer 28. The connecting mold layer 20 may be partially removed in an extension area EX before formation of the support conductive layer 25. As the connecting mold layer 20 is partially removed, a portion of an upper surface of the semiconductor layer 17 may be exposed. The support conductive layer 25 may be formed to cover the connecting mold layer 20 and the exposed semiconductor layer 17. The support conductive layer 25 may be formed to have a recess R in a region from which the connecting mold layer 20 is partially removed. A buffer insulator may be formed on the support conductive layer 25. The buffer insulator may be formed to cover the support conductive layer 25 and fill the recess R. A portion of each of the semiconductor layer 17, the connecting mold layer 20, the support conductive layer 25 and the buffer insulator in the extension area EX may be removed, thereby forming a trench, and a buried insulator filling the trench may then be formed. The buried insulator may be formed to cover the buffer insulator. Thereafter, each of the buried insulator and the buffer insulator may be partially removed through a planarization process, thereby forming the buffer insulating layer 27 and the buried insulating layer 28. The buffer insulating layer 27 may fill the recess R of the support conductive layer 25, and the buried insulating layer 28 may fill the trench. Top surfaces of the support conductive layer 25, the buffer insulating layer 27 and the buried insulating layer 28 may be coplanar.

Figure 22:
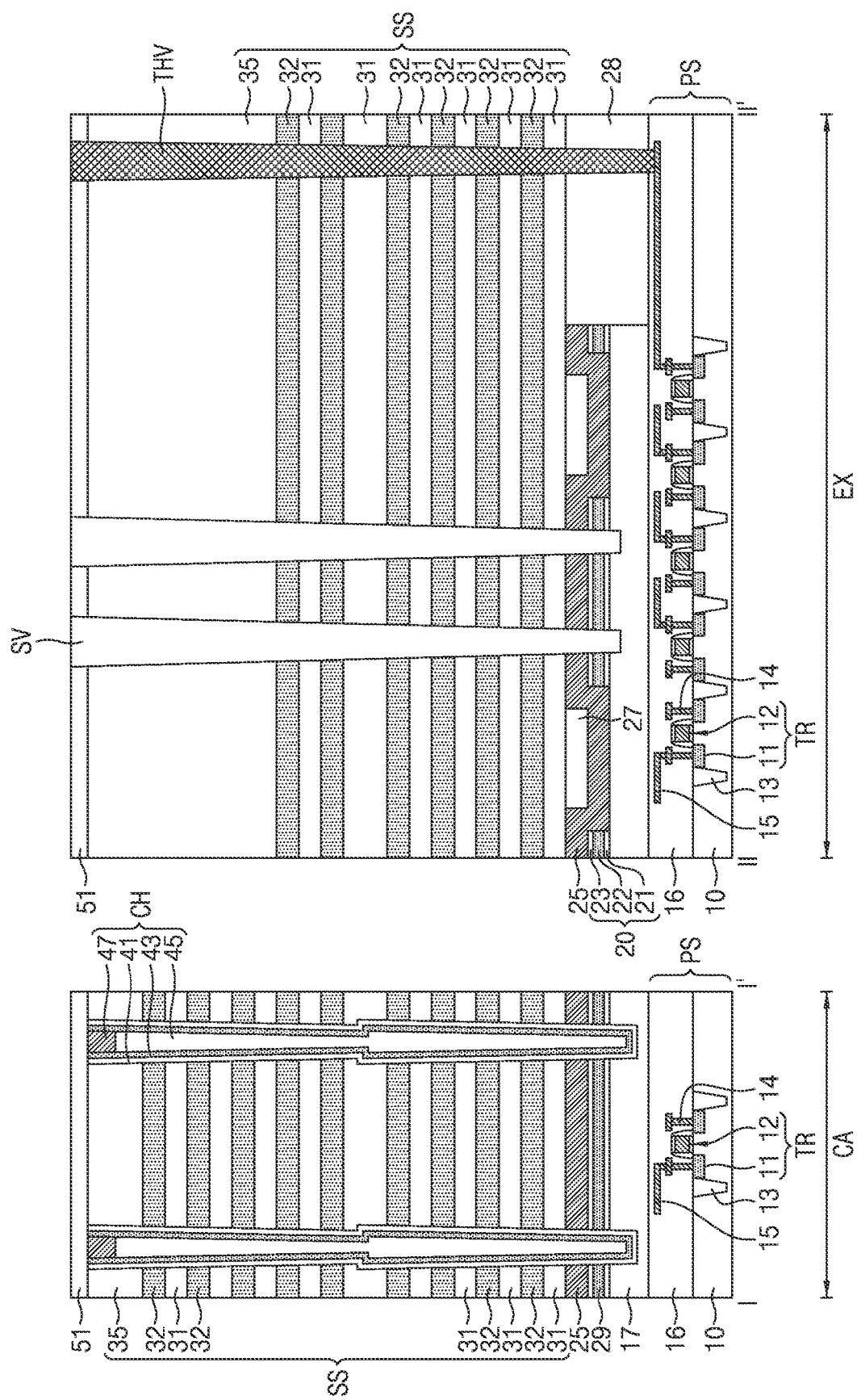

Referring to FIG. 22, the method may include forming a mold structure SS, channel structures CH, a first upper insulating layer 51, supporters SV, and THVs THV.

Formation of the mold structure SS may include alternately stacking gate insulating layers 31 and sacrificial layers 32, trimming the gate insulating layers 31 and the sacrificial layers 32, and forming a mold layer 35. The gate insulating layers 31 may include a material having etch selectivity with respect to the sacrificial layers 32. For example, the sacrificial layers 32 may include silicon nitride, and the gate insulating layers 31 may include silicon oxide. Trimming of the gate insulating layers 31 and the sacrificial layers 32 may include repetition of forming a mask pattern on the gate insulating layers 31 and the sacrificial layers 32, etching portions of the gate insulating layers 31 and the sacrificial layers 32 using the mask pattern, reducing a horizontal area of the mask pattern and etching portions of the gate insulating layers 31 and the sacrificial layers 32 using the area-reduced mask pattern. Through the trimming process, a staircase structure, in which heights of the gate insulating layers 31 and the sacrificial layers 32 are reduced stepwise as the gate insulating layers 31 and the sacrificial layers 32 extend from a cell area CA to the extension area EX, may be formed. The mold layer 35 may be formed to cover the trimmed gate insulating layers 31 and the trimmed sacrificial layers 32. The mold layer 35 may include a material having etch selectivity with respect to the sacrificial layers 32. For example, the mold layer 35 may include at least one of silicon oxide, silicon oxynitride, a low-k dielectric material, a high-k dielectric material, or a combination thereof. A top surface of the mold layer 35 may be planarized by a process such as chemical mechanical polishing (CMP).

The channel structures CH may be formed to extend through the mold structure SS in the cell area CA. The channel structures CH may extend into the semiconductor layer 17 and extend through the support conductive layer 25 and the connecting mold layer 20. Formation of the channel structures CH may include forming a channel hole extending through the mold structure SS, the support conductive layer 25 and the connecting mold layer 20 in the cell area CA, and sequentially forming an information storage pattern 41, a channel pattern 43, a buried insulating pattern 45 and a conductive pad 47 in the channel hole.

The first upper insulating layer 51 may be formed on the mold layer 35 and the channel structures CH. The supporters SV may be formed to extend through the first upper insulating layer 51 and the mold structure SS in the extension area EX. The supporters SV may be formed to be connected to the semiconductor layer 17 and extend through the support conductive layer 25 and the connecting mold layer 20. Formation of the supporters SV may include forming a hole extending through the first upper insulating layer 51, the mold layer 35, the mold structure SS, the support conductive layer 25 and the connecting mold layer 20 in the extension area EX, and forming an insulator in the hole.

The THVs THV may be formed to extend through the first upper insulating layer 51, the mold structure SS and the buried insulating layer 28 in the extension area EX. The THVs THV may be electrically connected to the peripheral circuit wiring 15 and extend into the peripheral circuit structure PS. Formation of the THVs THV may include forming a hole extending through the first upper insulating layer 51, the mold structure SS and the buried insulating layer 28, and forming a conductive material in the hole.

Figure 23:
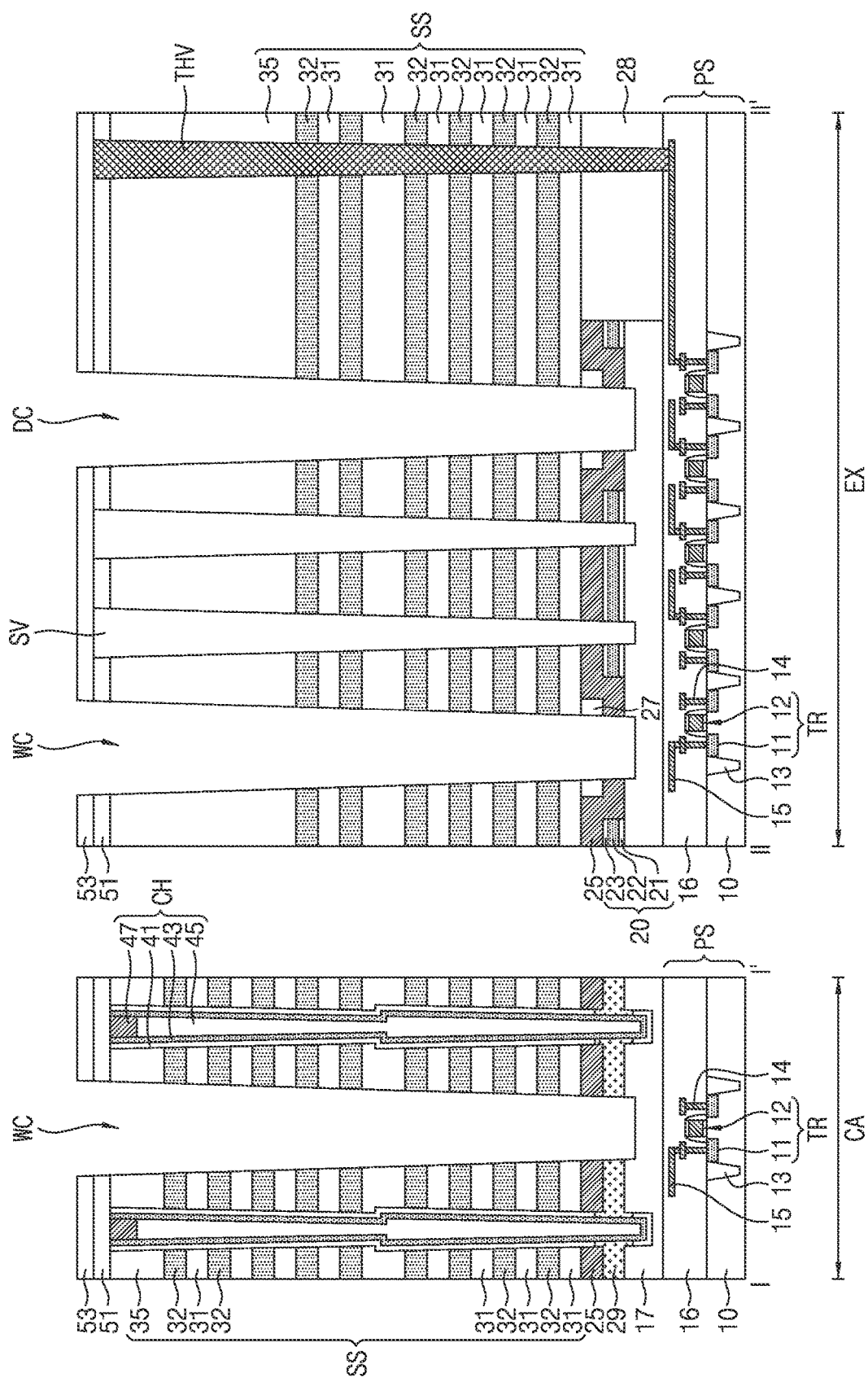

Referring to FIG. 23, the method may include forming a second upper insulating layer 53, a word line cut WC, a dam cut DC, and a source conductive layer 29. The second upper insulating layer 53 may be formed to cover the first upper insulating layer 51, the supporters SV and the THVs THV.

The word line cut WC and the dam cut DC may be simultaneously formed. In an embodiment, the word line cut WC and the dam cut DC may be formed through separate processes, respectively. The word line cut WC may be formed in the cell area CA and the extension area EX. The word line cut WC may extend in a second direction (cf. "D2" in FIG. 5) directing from the cell area CA to the extension area EX. The word line cut WC may be formed to extend through the connecting mold layer 20, the support conductive layer 25, the mold structure SS, the first upper insulating layer 51 and the second upper insulating layer 53 in the cell area CA. The word line cut WC may be formed to extend through the support conductive layer 25, the buffer insulating layer 27, the mold structure SS, the first upper insulating layer 51 and the second upper insulating layer 53 in the extension area EX. The word line cut WC may expose the semiconductor layer 17 in each of the cell area CA and the extension area EX. The word line cut WC may expose the connecting mold layer 20 in the cell area CA.

The dam cut DC may be formed in the extension area EX. The dam cut DC may be formed to have a quadrangular shape when viewed in a top view. The dam cut DC may be formed to surround the buried insulating layer 28 when viewed in a top view. The dam cut DC may be formed to extend through the support conductive layer 25, the buffer insulating layer 27, the mold structure SS, the first upper insulating layer 51 and the second upper insulating layer 53. The dam cut DC may expose the semiconductor layer 17. The dam cut DC may recess a portion of the semiconductor layer 17.

The connecting mold layer 20, which is exposed by the word line cut WC in the cell area CA, may be removed. Removal of the connecting mold layer 20 may include an isotropic etching process. As the connecting mold layer 20 is removed, side surfaces of the channel structures CH may be partially exposed. In accordance with removal of the connecting mold layer 20, the information storage pattern 41 of each channel structure CH may be exposed. As the information storage pattern 41 of the channel structure CH is partially etched, the channel pattern 43 of the channel structure CH may be partially exposed. A spacer may be formed in the word line cut WC and the dam cut DC in order to prevent the mold structure SS, the first upper insulating layer 51 and the second upper insulating layer 53 from being etched when the connecting mold layer 20 and the information storage pattern 41 are partially etched.

The source conductive layer 29 may be formed by depositing a conductive material in a space formed through removal of the connecting mold layer 20 in the cell area CA. The source conductive layer 29 may contact the channel pattern 43 and the information storage pattern 41 of each channel structure CH while being filled between the semiconductor layer 17 and the support conductive layer 25 in the cell area CA. For example, the source conductive layer 29 may include doped polysilicon. After formation of the source conductive layer 29, an anisotropic etching process may be performed in order to remove the conductive material formed in the word line cut WC and the dam cut DC. The spacer formed in the word line cut WC and the dam cut DC may also be removed.

Figure 24:
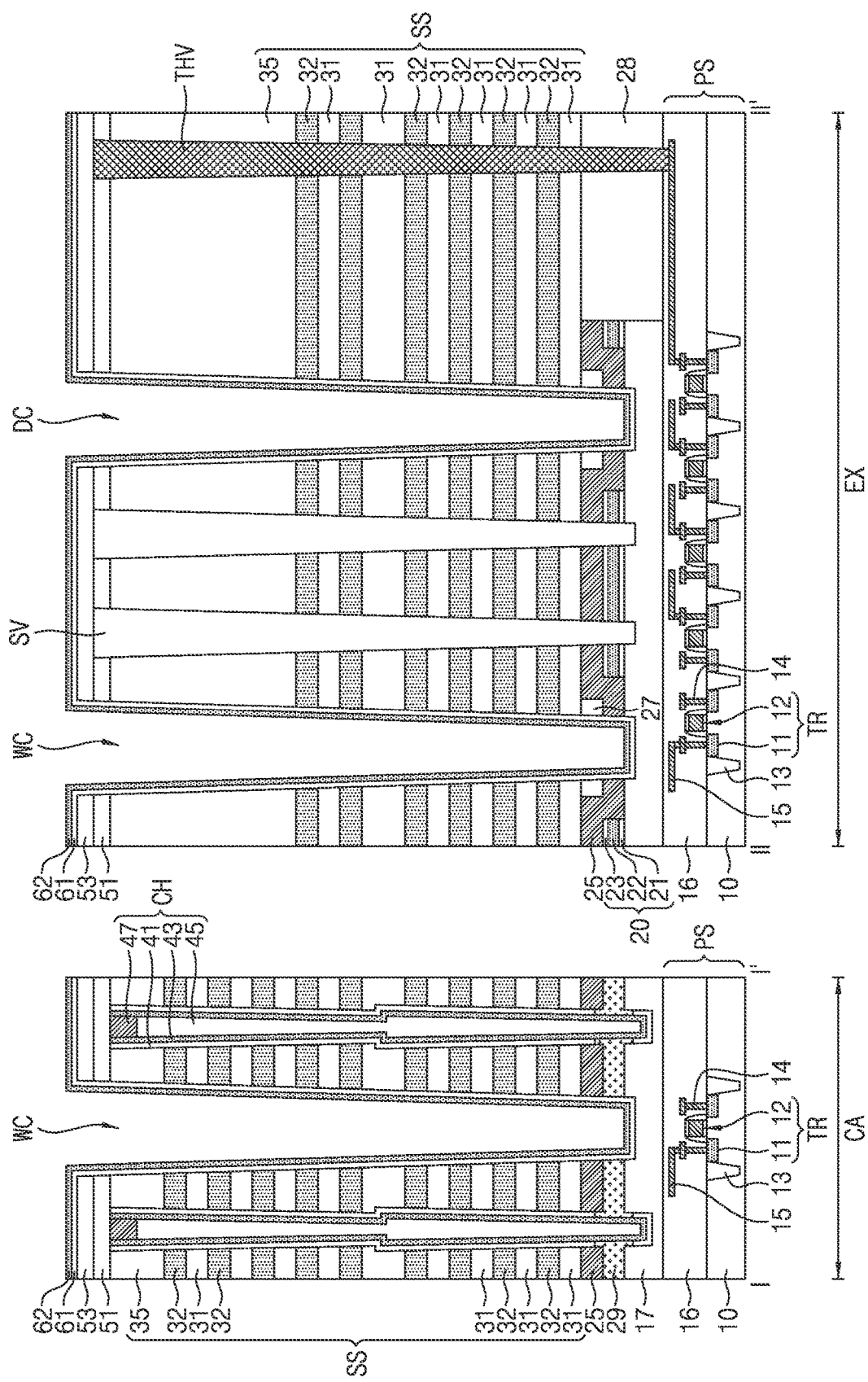

Referring to FIG. 24, the method may include forming a first insulating layer 61 and a second insulating layer 62. The first insulating layer 61 may conformally cover the mold SS, the first upper insulating layer 51 and the second upper insulating layer 53. The first insulating layer 61 may be formed in the word line cut WC and the dam cut DC. The first insulating layer 61 may cover a side wall and a bottom surface of the word line cut WC. The first insulating layer 61 may cover a side wall and a bottom surface of the dam cut DC. The first insulating layer 61 may cover a top surface of the second upper insulating layer 53. The first insulating layer 61 may cover side walls of the source conductive layer 29, the support conductive layer 25, the buffer insulating layer 27, the mold structure SS, the first upper insulating layer 51 and the second upper insulating layer 53, and may cover the semiconductor layer 17. For example, the first insulating layer 61 may include oxide.

The second insulating layer 62 may cover a top surface of the first insulating layer 61. The second insulating layer 62 may be conformally formed. The second insulating layer 62 may be formed in the word line cut WC and the dam cut DC. For example, the second insulating layer 62 may include nitride. For example, each of the first insulating layer 61 and the second insulating layer 62 may be formed by a chemical vapor deposition (CVD) process and/or an atomic layer deposition (ALD) process.

Figure 25:
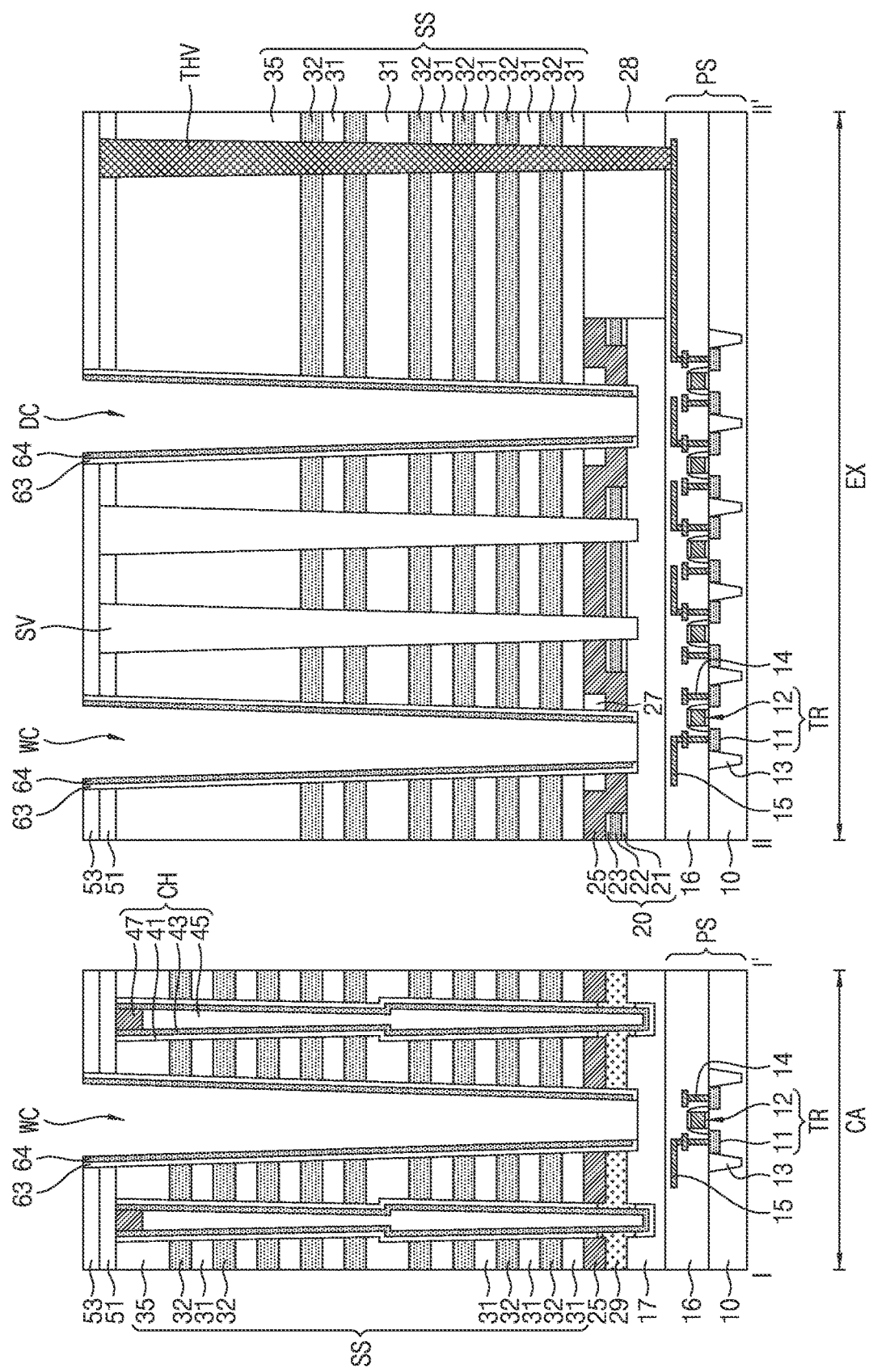

Referring to FIG. 25, the method may include forming a first spacer 63 and a second spacer 64. The first spacer 63 and the second spacer 64 may be formed by partially removing the first insulating layer 61 and the second insulating layer 62 through an etch-back process. As the first insulating layer 61 is partially removed, the first spacer 63 may be formed. As the second insulating layer 62 is partially removed, the second spacer 64 may be formed. The first spacer 63 and the second spacer 64 may be formed by performing an etch-back process until the semiconductor layer 17 is exposed through the word line cut WC and the dam cut DC. The first insulating layer 61 and the second insulating layer 62 may be partially removed through the etch-back process and, as such, the top surface of the second upper insulating layer 53 may be exposed.

Figure 26:
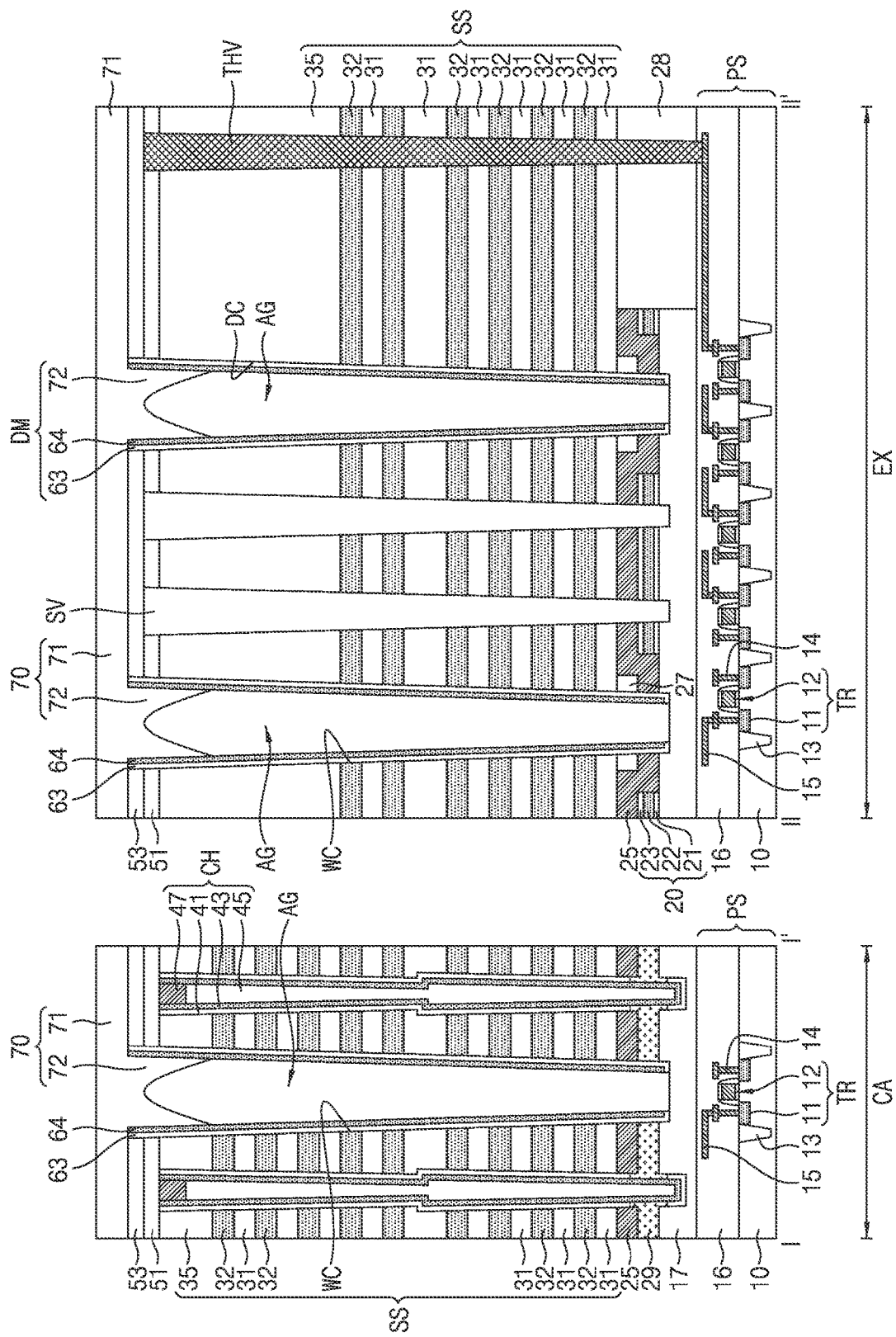

Referring to FIG. 26, the method may include forming a supporter layer 70. The supporter layer 70 may be formed by performing a process having relatively bad step coverage. For example, the supporter layer 70 may be formed through a physical vapor deposition (PVD) process or a chemical vapor deposition (CVD) process. For example, the supporter layer 70 may include oxide.

The supporter layer 70 may be formed on the second upper insulating layer 53. The supporter layer 70 may include an upper supporter layer 71 and a lower supporter layer 72. The upper supporter layer 71 may cover the top surface of the second upper insulating layer 53 and respective upper ends of the first spacer 63 and the second spacer 64. The lower supporter layer 72 may extend from a bottom surface of the upper supporter layer 71 toward the substrate 10. The lower supporter layer 72 may extend into the word line cut WC and the dam cut DC. The lower supporter layer 72 may be buried in portions of upper sections of the word line cut WC and the dam cut DC. The lower supporter layer 72 may be formed on an inner side wall of the second spacer 64 in the word line cut WC and the dam cut DC. The lower supporter layer 72 may cover a portion of an upper section of the second spacer 64 in the word line cut WC and the dam cut DC. A bottom surface of the lower supporter layer 72 may be curved. Inner spaces of the word line cut WC and the dam cut DC may be closed by the lower supporter layer 72. The closed empty space or void of each of the word line cut WC and the dam cut DC may be defined as an air gap AG. The air gap AG may be defined by a portion of the inner side wall of the second spacer 64, the bottom surface of the lower supporter layer 72, a portion of an inner side wall of the first spacer 63, and a portion of the recessed upper surface of the semiconductor layer 17.

Figure 27:
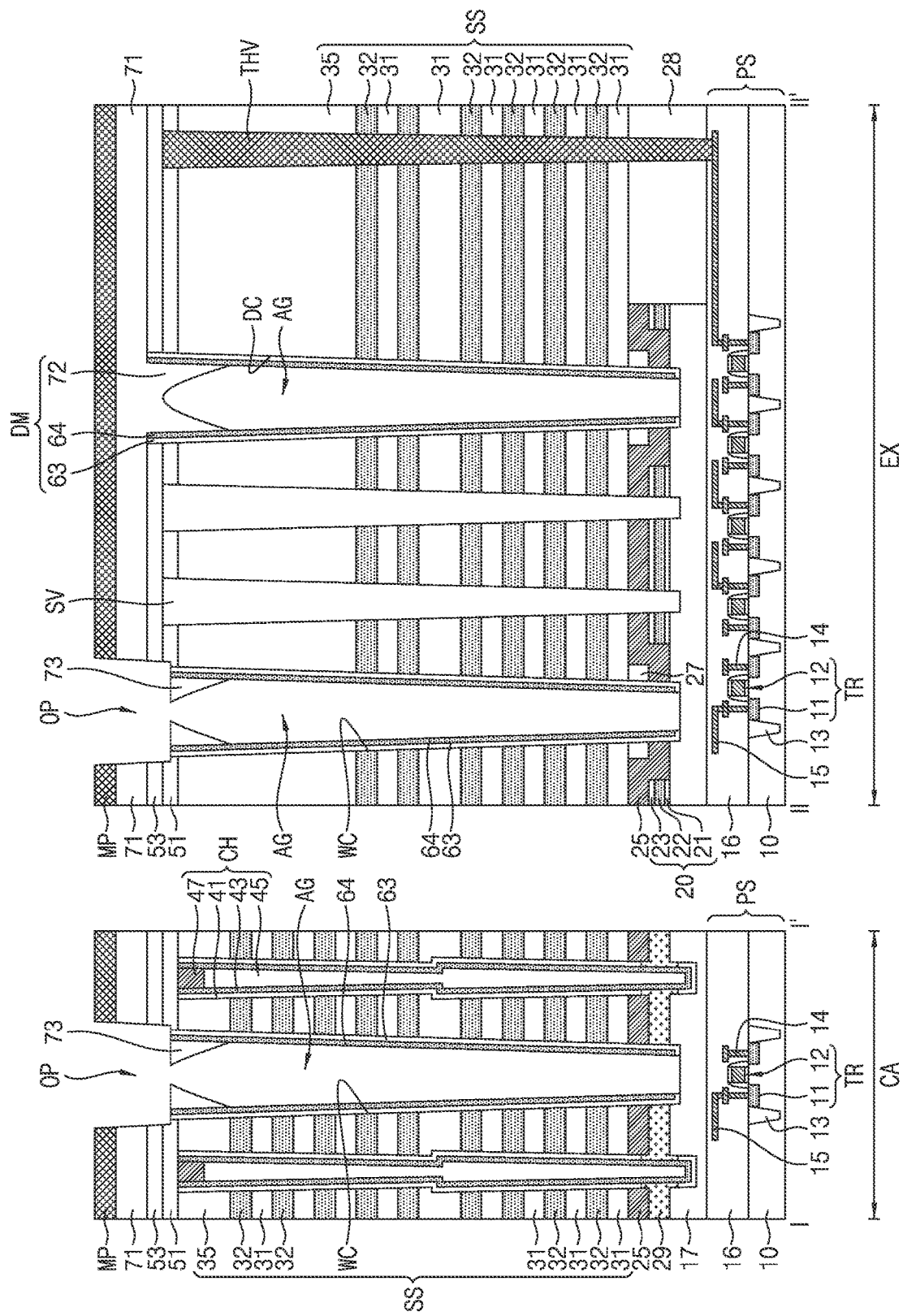

Referring to FIG. 27, the method may include forming a lower supporter pattern 73. Formation of the lower supporter pattern 73 may include forming a mask pattern MP, and forming an opening OP.

The mask pattern MP may be formed on the supporter layer 70. The mask pattern MP may be formed such that the mask pattern MP does not vertically overlap with at least a portion of the word line cut WC. Portions of the supporter layer 70, the second upper insulating layer 53, the first spacer 63 and the second spacer 64 may be removed as an etching process using the mask pattern MP as an etch mask is performed and, as such, the opening OP may be formed. The opening OP may expose the lower supporter layer 72, the first spacer 63, the second spacer 64, the second upper insulating layer 53 and the upper supporter layer 71. The etching process may also etch the first upper insulating layer 51. In this case, the opening OP may further expose the first upper insulating layer 51. The etching process may be an anisotropic etching process. A portion of the lower supporter layer 72 may be etched through the etching process and, as such, a top end of the air gap AG in the word line cut WC may be opened. As the top end of the air gap AG is opened, the air gap AG may communicate with the opening OP. As a portion of an upper section of the lower supporter layer 72 is etched, the lower supporter pattern 73 may be formed. The lower supporter pattern 73 may cover a portion of the inner side wall of the second spacer 64 at an upper section of the second spacer 64. An upper section of the lower supporter pattern 73 may be opened and, as such, the air gap AG and the opening OP may communicate with each other.

Figure 28:
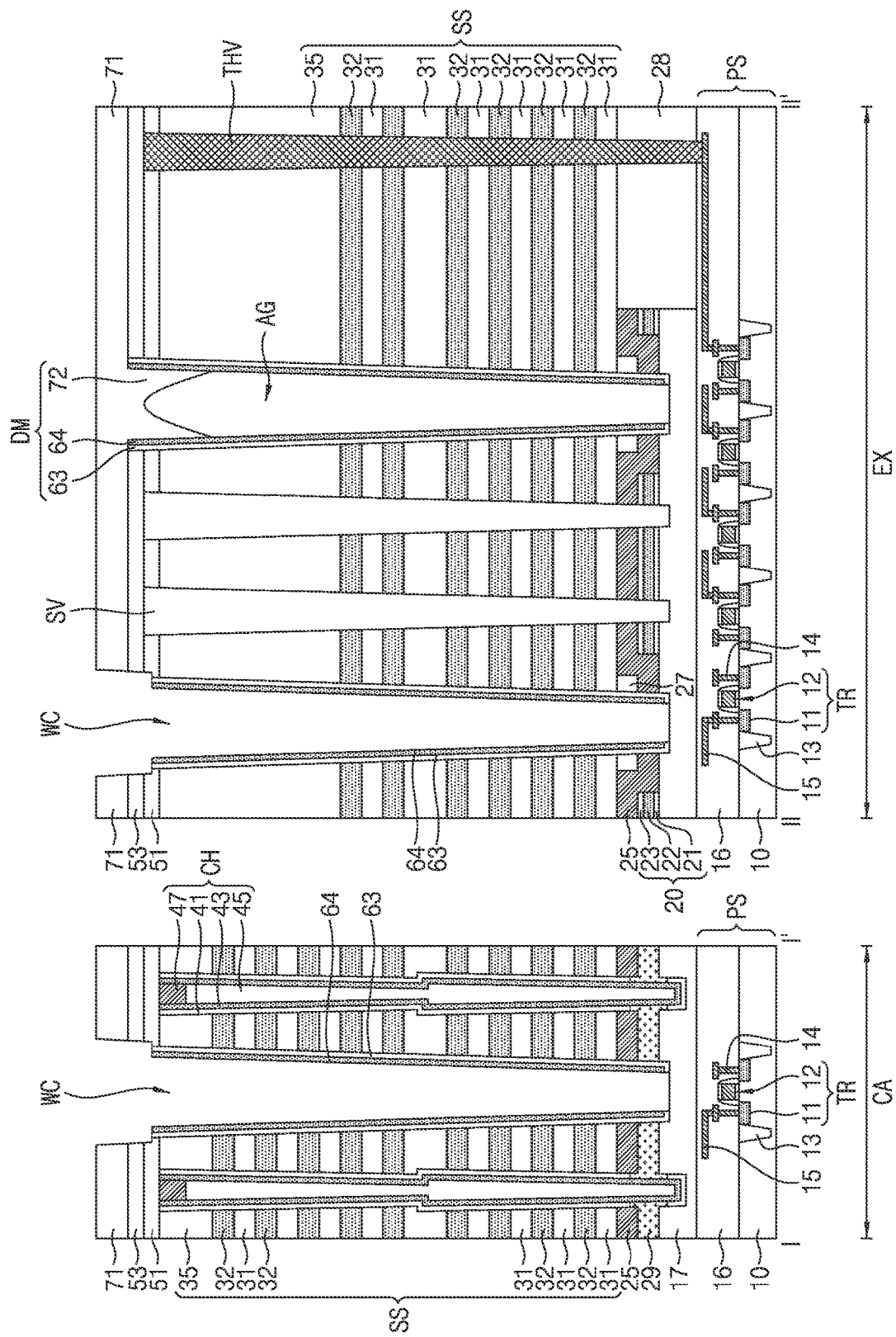

Referring to FIG. 28, the method may include removing the lower supporter pattern 73. Removal of the lower supporter pattern 73 may include an anisotropic etching process and/or an isotropic etching process. As the lower supporter pattern 73 is removed, the inner side wall of the second spacer 64 may be completely exposed. The method may include removing the mask pattern MP.

Figure 29:
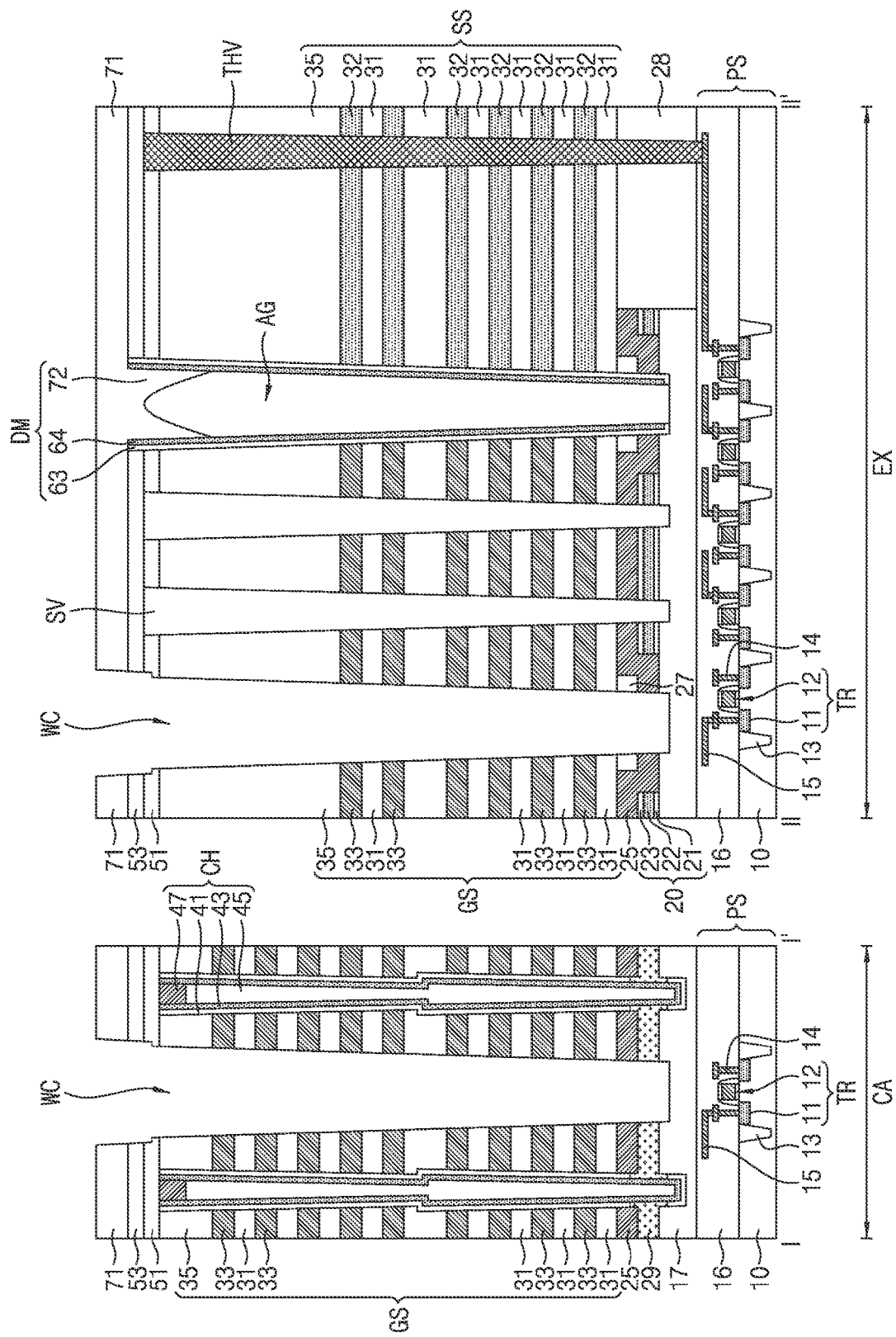

Referring to FIG. 29, the method may include removing the first spacer 63 and the second spacer 64. As the first spacer 63 and the second spacer 64 are removed, the word line cut WC may again be completely opened. An inner side wall of the mold structure SS may be exposed through the word line cut WC.

The method may include forming a gate stack structure GS. Formation of the gate stack structure GS may include forming gate electrodes 33. Portions of the sacrificial layers 32 of the molding structure SS may be removed through the word line cut WC. The sacrificial layers 32 may be removed only at portions thereof outside the dam structure DM, and may not be removed at portions thereof inside the dam structure DM. The gate electrodes 33 may be formed by forming a conductive material in empty spaces formed through removal of the sacrificial layers 32.

Referring to FIG. 6, the method may include forming word line separation layers WS in the word line cut WC. After formation of the word line separation layers WS, a third upper insulating layer 75, a bit line contact plug BP, a bit line BL, a THV contact plug TC, and a top line TL may be formed.

In accordance with the example embodiments of the disclosure, it may be possible to provide a semiconductor device and a manufacturing method thereof which are capable of simplifying manufacturing process steps while including a supporter layer preventing inclination caused by a high aspect ratio of the semiconductor device and an air gap in a dam structure preventing formation of cracks, thereby reducing process costs.

While the embodiments of the disclosure have been described with reference to the accompanying drawings, it should be understood by those skilled in the art that various modifications may be made without departing from the scope of the disclosure. Therefore, the above-described embodiments should be considered in a descriptive sense only and not for purposes of limitation.

What is claimed is:
1. A semiconductor device comprising:
  a peripheral circuit structure comprising a substrate and a transistor, the substrate comprising a cell area and an extension area;
  a semiconductor layer on the peripheral circuit structure;
  a source conductive layer on the semiconductor layer in the cell area;
  a connecting mold layer on the semiconductor layer in the extension area;
  a support conductive layer on the source conductive layer and the connecting mold layer;
  a buried insulating layer on the peripheral circuit structure in the extension area and contacting a side wall of the semiconductor layer;
  a gate stack structure on the support conductive layer;
  a mold structure on the buried insulating layer;
  a channel structure and a supporter layer extending through the gate stack structure;

a through hole via (THV) extending through the mold structure and the buried insulating layer;
a dam structure between the gate stack structure and the mold structure;
wherein the supporter layer comprises an upper supporter layer and a lower supporter layer, with the upper supporter layer on the dam structure; and
a word line separation layer extending through the gate stack structure and the upper supporter layer,
wherein the dam structure comprises
a first spacer, and a second spacer on an inner side wall of the first spacer,
the lower supporter layer is connected to the upper supporter layer and on a portion of an inner side wall of the second spacer, and
an air gap with a side defined by the second spacer and a top end defined by the lower supporter layer.

2. The semiconductor device according to claim 1, wherein the air gap is defined by the first spacer, the second spacer, the lower supporter layer, and the semiconductor layer.

3. The semiconductor device according to claim 1, wherein:
the lower supporter layer has a bottom surface comprising a first inclined surface, and a second inclined surface connected to the first inclined surface at a vertex that forms in inverted U-shape or V-shape; and
a portion of an upper section of the air gap extends into the lower supporter layer between the first inclined surface and the second inclined surface.

4. The semiconductor device according to claim 3, wherein the air gap extends vertically along a length of the second spacer with a width of the upper section of the air gap that is gradually reduced as the upper section extends upwards into the lower supporter layer.

5. The semiconductor device according to claim 1, wherein a level of a bottom end of the air gap is lower than a level of an upper surface of the semiconductor layer.

6. The semiconductor device according to claim 1, wherein the first spacer comprises:
a first section contacting an outer side wall of the second spacer; and
a second section contacting a lower end of the second spacer.

7. The semiconductor device according to claim 6, wherein the air gap directly contacts an inner side wall of the second section.

8. The semiconductor device according to claim 1, wherein the first spacer comprises an oxide, and the second spacer comprises a nitride.

9. The semiconductor device according to claim 1, wherein the upper supporter layer and the lower supporter layer are integrated with each other, and comprise a same material.

10. The semiconductor device according to claim 1, further comprising:
a first upper insulating layer and a second upper insulating layer between the gate stack structure and the upper supporter layer and that are positioned between the mold structure and the upper supporter layer,
wherein the first spacer, the second spacer and the lower supporter layer extend through the first upper insulating layer and the second upper insulating layer.

11. The semiconductor device according to claim 1, wherein:
the first spacer comprises
a first outer spacer contacting the gate stack structure, and
a first inner spacer contacting the mold structure; and
the dam structure further comprises a horizontal layer interconnecting the first outer spacer and the first inner spacer.

12. The semiconductor device according to claim 11, wherein the air gap is defined by the second spacer, the lower supporter layer and the horizontal layer.

13. A semiconductor device comprising:
a gate stack structure in which gate electrodes and gate insulating layers are alternately and repeatedly stacked;
a mold structure in which sacrificial layers and gate insulating layers are alternately and repeatedly stacked;
a dam structure between the gate stack structure and the mold structure and surrounding the mold structure;
a channel structure extending through the gate stack structure;
a through hole via (THV) inside the dam structure and extending through the mold structure;
an upper supporter layer on the gate stack structure, the mold structure, the dam structure, the channel structure and the THV; and
a word line separation layer extending through the gate stack structure and the upper supporter layer,
wherein the dam structure comprises
a first spacer, and a second spacer on an inner side wall of the first spacer,
a lower supporter layer connected to the upper supporter layer and on at least a portion of an inner side wall of the second spacer, and
an air gap with a side defined by the second spacer, at least a portion of the air gap extending into the lower supporter layer.

14. The semiconductor device according to claim 13, wherein a level of a bottom end of the lower supporter layer is higher than a level of an upper surface of an uppermost one of the sacrificial layers.

15. The semiconductor device according to claim 13, wherein a level of a bottom end of the lower supporter layer is lower than a level of an upper surface of an uppermost one of the sacrificial layers.

16. The semiconductor device according to claim 13, wherein:
the lower supporter layer covers an entirety of the inner side wall of the second spacer; and
the air gap is defined by the lower supporter layer.

17. The semiconductor device according to claim 13, wherein:
the first spacer comprises
a first section contacting an outer side wall of the second spacer, and
a second section contacting a lower end of the second spacer; and
the air gap directly contacts an inner side wall of the second section.

18. The semiconductor device according to claim 13, further comprising:
a peripheral circuit structure; and
a semiconductor layer on the peripheral circuit structure,
wherein the air gap directly contacts a portion of the semiconductor layer.

19. An electronic system comprising:
a main substrate;
a semiconductor device on the main substrate; and
a controller electrically connected to the semiconductor device on the main substrate, wherein the semiconductor device comprises
  a semiconductor layer and a buried insulating layer,
  a gate stack structure in which gate electrodes and gate insulating layers are alternately and repeatedly stacked, the gate stack structure being positioned on the semiconductor layer,
  a mold structure in which sacrificial layers and gate insulating layers are alternately and repeatedly stacked, the mold structure being positioned on the buried insulating layer,
  a dam structure between the gate stack structure and the mold structure and surrounding the mold structure,
  a channel structure extending through the gate stack structure,
  a through hole via (THV) inside the dam structure and extending through the mold structure and the buried insulating layer,
  an upper supporter layer on the gate stack structure, the mold structure, the dam structure, the channel structure, and the THV, and
  a word line separation layer extending through the gate stack structure and the upper supporter layer,
wherein the dam structure comprises
  a spacer extending between the gate stack structure and the mold structure,
  a lower supporter layer connected to the upper supporter layer and on a portion of an inner side wall of the spacer, and
  an air gap defined by the semiconductor layer, the spacer and the lower supporter layer.

20. The electronic system according to claim 19, wherein:
the spacer comprises a first spacer, and a second spacer on an inner side wall of the first spacer;
the first spacer comprises an oxide; and
the second spacer comprises a nitride.

* * * * *